US012488760B2

(12) United States Patent
Lu et al.

(10) Patent No.: US 12,488,760 B2

(45) Date of Patent: Dec. 2, 2025

(54) DISPLAY SUBSTRATE REDUCING ARRANGEMENT SPACE OCCUPIED BY SECOND ELECTROSTATIC DISCHARGE CIRCUIT

(71) Applicants: Chengdu BOE Optoelectronics Technology Co., Ltd., Sichuan (CN); BOE Technology Group Co., Ltd., Beijing (CN)

(72) Inventors: Yanwei Lu, Beijing (CN); Zhuoran Yan, Beijing (CN); Quan Shi, Beijing (CN); Yudiao Cheng, Beijing (CN); Fengli Ji, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/689,083

(22) PCT Filed: Aug. 8, 2023

(86) PCT No.: PCT/CN2023/111733

§ 371 (c)(1),
(2) Date: Mar. 5, 2024

(87) PCT Pub. No.: WO2024/046054

PCT Pub. Date: Mar. 7, 2024

(65) Prior Publication Data

US 2025/0131886 A1 Apr. 24, 2025

(30) Foreign Application Priority Data

Aug. 30, 2022 (CN) ......................... 202211048005.2

(51) Int. Cl.
*G09G 3/3266* (2016.01)
*H10K 59/131* (2023.01)

(52) U.S. Cl.
CPC ......... *G09G 3/3266* (2013.01); *H10K 59/131* (2023.02); *G09G 2310/0297* (2013.01);
(Continued)

(58) Field of Classification Search
CPC .......... G09G 3/30; G09G 3/32; G09G 3/3208; G09G 3/3216; G09G 3/3225;
(Continued)

(56) References Cited

U.S. PATENT DOCUMENTS

| | | | | |
|---|---|---|---|---|
| 11,756,468 B2 * | 9/2023 | You | G09G 3/20 345/107 | |
| 2010/0265168 A1 * | 10/2010 | Neugebauer | G09G 3/3614 345/87 | |

(Continued)

FOREIGN PATENT DOCUMENTS

| | | |
|---|---|---|
| CN | 108470522 A | 8/2018 |
| CN | 111223436 A | 6/2020 |

(Continued)

OTHER PUBLICATIONS

International Search Report for PCT/CN2023/111733 Mailed Nov. 28, 2023.

*Primary Examiner* — Ke Xiao
*Assistant Examiner* — Nelson Lam
(74) *Attorney, Agent, or Firm* — Ling Wu; Stephen Yang; Ling and Yang Intellectual Property

(57) ABSTRACT

The present disclosure provides a display substrate including a base substrate, a plurality of data lines, a plurality of multiplexing circuits, a plurality of multiplexing data lines, a plurality of first electrostatic discharge circuits, a plurality of second electrostatic discharge circuits, and a plurality of
(Continued)

first signal lines located on the base substrate. The plurality of multiplexing circuits are sequentially arranged along edges of the display region. The plurality of multiplexing circuits are electrically connected with the plurality of multiplexing data lines and the plurality of data lines. The plurality of first electrostatic discharge circuits are electrically connected to the plurality of multiplexing data lines, and the plurality of second electrostatic discharge circuits are electrically connected to the plurality of first signal lines.

18 Claims, 18 Drawing Sheets

(52) U.S. Cl.
CPC ............... *G09G 2320/0233* (2013.01); *G09G 2330/021* (2013.01); *G09G 2330/04* (2013.01)

(58) Field of Classification Search
CPC .... G09G 3/3233; G09G 3/3241; G09G 3/325; G09G 3/3258; G09G 3/3266; G09G 3/3275; G09G 3/3283; G09G 3/3291; G09G 2310/0297; G09G 2330/04; G09G 2330/10; G09G 2330/12
USPC ...................................................... 345/76–83
See application file for complete search history.

(56) References Cited

U.S. PATENT DOCUMENTS

| | | | | |
|---|---|---|---|---|
| 2014/0009375 | A1* | 1/2014 | Tsai | G02F 1/136286 345/98 |
| 2019/0066595 | A1* | 2/2019 | Kim | G09G 3/006 |
| 2021/0407428 | A1* | 12/2021 | Kang | G09G 3/3275 |
| 2022/0077273 | A1* | 3/2022 | Qing | H10K 59/1216 |
| 2022/0189377 | A1* | 6/2022 | Wang | G09G 3/3266 |
| 2022/0328574 | A1* | 10/2022 | Jiang | H01L 23/60 |
| 2025/0234650 | A1* | 7/2025 | Dong | H10D 86/423 |

FOREIGN PATENT DOCUMENTS

| | | | |
|---|---|---|---|
| CN | 111681554 | A | 9/2020 |
| CN | 114447068 | A | 5/2022 |
| CN | 114464644 | A | 5/2022 |
| CN | 114937420 | A | 8/2022 |
| CN | 115294889 | A | 11/2022 |
| CN | 113939912 | B | 2/2023 |
| WO | 2022028132 | A1 | 2/2022 |

* cited by examiner

DISPLAY SUBSTRATE REDUCING ARRANGEMENT SPACE OCCUPIED BY SECOND ELECTROSTATIC DISCHARGE CIRCUIT

CROSS-REFERENCE TO RELATED APPLICATIONS

The present application is a U.S. National Phase Entry of International Application PCT/CN2023/111733 having an international filing date of Aug. 8, 2023, which claims priority to Chinese Patent Application No. 202211048005.2 filed to the CNIPA on Aug. 30, 2022 and entitled "Display substrate, Display Panel, and Display Device", and the contents disclosed in the above-mentioned applications are hereby incorporated as a part of this application.

TECHNICAL FIELD

The present disclosure relates to, but is not limited to, the field of display technologies, in particular to a display substrate, a display panel, and a display device.

BACKGROUND

An Organic Light Emitting Diode (OLED) and a Quantum dot Light Emitting Diode (QLED) are active light emitting display devices and have advantages of self-luminescence, a wide viewing angle, a high contrast ratio, low power consumption, an extremely high response speed, lightness and thinness, bendability, and a low cost, etc.

SUMMARY

The following is a summary of subject matter described herein in detail. This summary is not intended to limit the protection scope of the claims.

At least one embodiment of the present disclosure provides a display substrate, display panel and a display device.

In one aspect, an embodiment of the present disclosure provides a display substrate including a display region and a bezel region located around the display region. The display substrate includes a base substrate, a plurality of data lines located in the display region, a plurality of multiplexing circuits, a plurality of multiplexing data lines, a plurality of first electrostatic discharge circuits, a plurality of second electrostatic discharge circuits, and a plurality of first signal lines located in a bezel region. The plurality of multiplexing circuits are sequentially arranged along edges of the display region. The plurality of multiplexing circuits are electrically connected with the plurality of multiplexing data lines and the plurality of data lines. The plurality of first electrostatic discharge circuits are electrically connected to the plurality of multiplexing data lines, and the plurality of second electrostatic discharge circuits are electrically connected to the plurality of first signal lines. The plurality of first electrostatic discharge circuits and the plurality of second electrostatic discharge circuits are located at a side of the plurality of multiplexing circuits away from the display region, and a plurality of second electrostatic discharge circuits are interspersed in the plurality of first electrostatic discharge circuits.

In some exemplary implementations, at least one of the plurality of second electrostatic discharge circuits is located at a side of the plurality of first electrostatic discharge circuits away from the display region.

In some exemplary implementations, the bezel region includes a first bezel region located at a side of the display region along a second direction, the plurality of multiplexing circuits are located in the first bezel region and arranged side by side along a first direction, and the first direction intersects with the second direction.

In some exemplary implementations, the multiplexing circuits are electrically connected to the plurality of data lines of the display region through a plurality of data fan-out lines, and the plurality of data fan-out lines are of a same layer structure.

In some exemplary implementations, the display substrate has a first centerline parallel to the second direction, the plurality of second electrostatic discharge circuits are located in a region, close to the first centerline, within the first bezel region and an edge region, away from the first centerline, within the first bezel region.

In some exemplary implementations, the bezel region further includes a second bezel region located at a side of the display region away from the first bezel region along the second direction. The display substrate also includes a plurality of test circuits located in the second bezel region, and the plurality of test circuits are arranged side by side along the first direction.

In some exemplary implementations, the bezel region further includes a third bezel region and a fourth bezel region located at opposite sides of the display region along the first direction, a first corner region connecting the first bezel region and the third bezel region, a second corner region connecting the third bezel region and the second bezel region, a third corner region connecting the second bezel region and the fourth bezel region, and a fourth corner region connecting the fourth bezel region and the first bezel region. The display substrate further includes a gate drive circuit located in the third bezel region, the fourth bezel region, the first corner region, the second corner region, the third corner region and the fourth corner region.

In some exemplary implementations, the multiplexing circuits close to the first corner region and the fourth corner region are electrically connected to the plurality of data lines of the display region through arc-shaped data fan-out lines.

In some exemplary implementations, the test circuits close to the second corner region and the third corner region are electrically connected to the plurality of data lines of the display region through arc-shaped data connection lines.

In some exemplary implementations, the display substrate further includes a first power supply line located in the bezel region, wherein the first power supply line at least includes a first sub-power supply line, a second sub-power supply line and a third sub-power supply line located in the first bezel region, the first sub-power supply line, the second sub-power supply line and the third sub-power supply line all extend along the second direction, the plurality of multiplexing circuits are separated by the second sub-power supply lines in the first direction.

In some exemplary implementations, the first power supply line further includes a fourth sub-power supply line and a fifth sub-power supply line located in the first bezel region, wherein the fourth sub-power supply line and the fifth sub-power supply line both extend along the first direction, the fourth sub-power supply line is located at a side of the fifth sub-power supply line close to the display region, the fourth sub-power supply line and the fifth sub-power supply line are both electrically connected to the first sub-power supply line, the second sub-power supply line and the third sub-power supply line; the plurality of multiplexing circuits, the plurality of first electrostatic discharge circuits and the plurality of second electrostatic discharge circuits are located between the fourth sub-power supply line and the fifth sub-power supply line.

In some exemplary implementations, at least one of the plurality of multiplexing data lines is electrically connected to a compensation resistor located at a side of the first electrostatic discharge circuit away from the display region. The first bezel region at least includes a peripheral circuit region, a signal access region located at a side of the peripheral circuit region away from the display region, and an encapsulation region located between the peripheral circuit region and the signal access region, wherein the compensation resistor is located in the encapsulation region and serves as an encapsulation underlay substrate.

In some exemplary implementations, an arrangement directions of a plurality of discharge transistors included in the first electrostatic discharge circuit and an arrangement directions of a plurality of discharge transistors included in the second electrostatic discharge circuit are opposite.

In some exemplary implementations, the plurality of first signal lines include a plurality of multiplexing control lines and a plurality of drive signal lines.

In another aspect, an embodiment of the present disclosure provides a display panel including the display substrate as described above, and light emitting elements disposed in the display region of the display substrate, wherein the light emitting elements are arranged in an array.

In another aspect, a display device is provided in an embodiment of the present disclosure, which includes the aforementioned display panel.

Other aspects of the present disclosure may be comprehended after the drawings and the detailed descriptions are read and understood.

BRIEF DESCRIPTION OF DRAWINGS

Accompanying drawings are used for providing further understanding of technical solutions of the present disclosure, constitute a part of the specification, and are used for explaining the technical solutions of the present disclosure together with embodiments of the present disclosure, but do not constitute limitations on the technical solutions of the present disclosure. Shapes and sizes of one or more components in the drawings do not reflect actual scales, and are only intended to schematically describe contents of the present disclosure.

DETAILED DESCRIPTION

Figure 1:
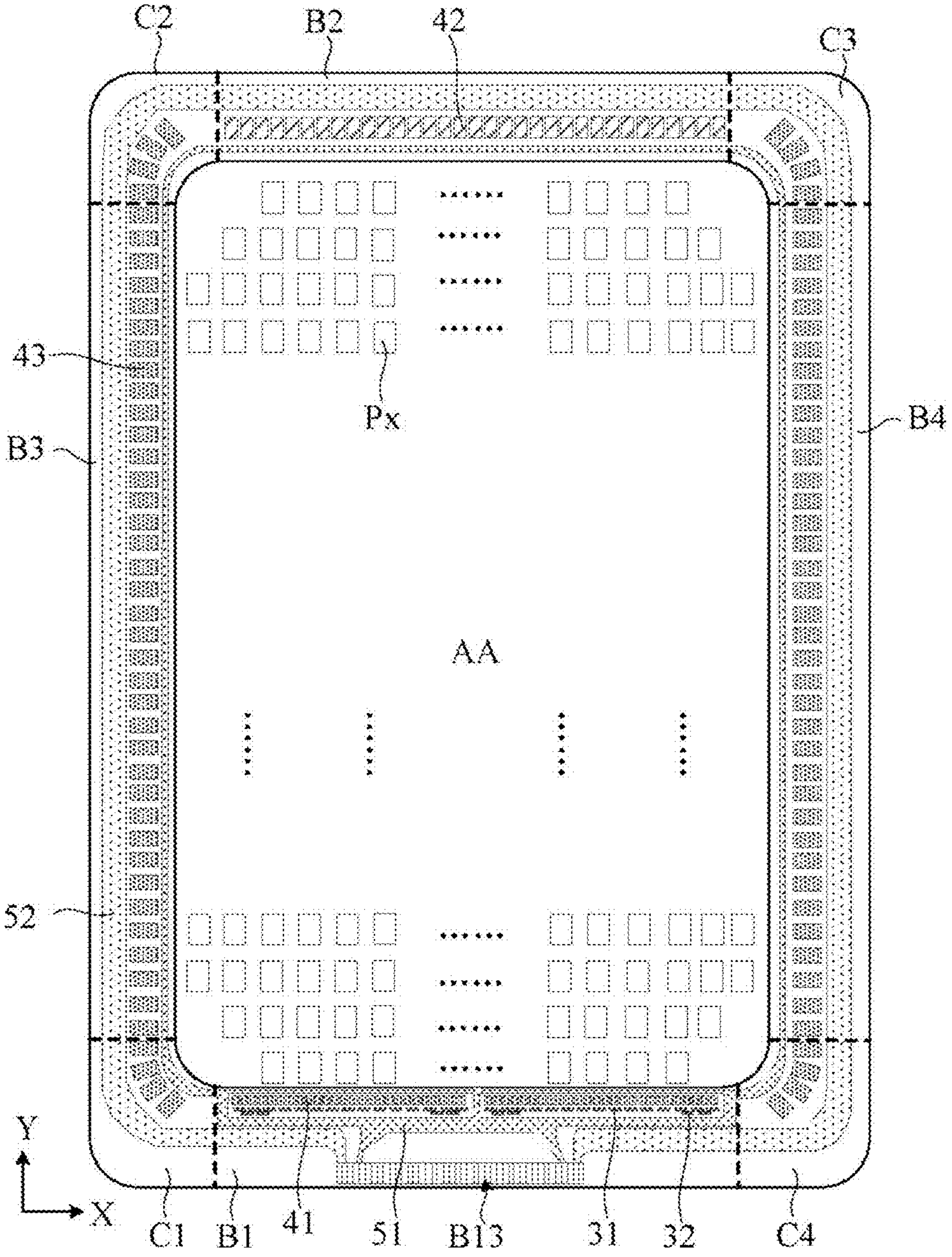
FIG. 1 is a schematic diagram of a display panel according to at least one embodiment of the present disclosure.

The embodiments of the present disclosure will be described below with reference to the drawings in detail. Implementation modes may be implemented in multiple different forms. Those of ordinary skills in the art may easily understand such a fact that modes and contents may be transformed into other forms without departing from the purpose and scope of the present disclosure. Therefore, the present disclosure should not be explained as being limited to the contents recorded in the following implementations only. The embodiments and features in the embodiments of the present disclosure may be randomly combined with each other if there is no conflicts.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect an actual scale. In addition, the accompanying drawings schematically illustrate ideal examples, and a mode of the present disclosure is not limited to shapes, numerical values, or the like shown in the drawings.

Ordinal numerals "first", "second", "third", etc., in the specification are set not to form limits in numbers but only to avoid confusion between composition elements. In the present disclosure, "plurality" represents two or more than two.

In the specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limitations on the present disclosure. The positional relationships between the constituent elements are changed as appropriate according to a direction where the constituent elements are described. Therefore, appropriate replacements based on situations are allowed, which is not limited to the expressions in the specification.

In the specification, unless otherwise specified and defined, terms "mounting", "mutual connection", and "connection" should be understood in a broad sense. For example, it may be a fixed connection, a detachable connection, or an integral connection; it may be a mechanical connection or a connection; it may be a direct connection, an indirect connection through a middleware, or internal communication inside two elements. Those of ordinary skills in the art may understand meanings of the aforementioned terms in the present disclosure according to situations.

In the specification, a transistor refers to an element which at least includes three terminals, i.e., a gate (gate electrode), a drain, and a source. The transistor has a channel region between the drain (drain electrode terminal, drain region, or drain electrode) and the source (source electrode terminal, source region, or source electrode), and a current can flow through the drain, the channel region, and the source. In the specification, the channel region refers to a region through which a current mainly flows.

In the specification, a first electrode may be a drain and a second electrode may be a source, or, a first electrode may be a source and a second electrode may be a drain. In addition, the gate may also be referred to as a control electrode. In a case that transistors with opposite polarities are used, or in a case that a direction of a current is changed during operation of a circuit, or the like, functions of the "source" and the "drain" are sometimes interchangeable. Therefore, the "source" and the "drain" are interchangeable in the specification.

In the specification, "electrical connection" includes connection of composition elements through an element with a certain electrical action. The "element having some electrical function" is not particularly limited as long as electrical signals between the connected constituent elements may be transmitted. Examples of the "element having some electrical function" not only include an electrode and a wiring, but also include a switching element such as a transistor, a resistor, an inductor, a capacitor, another element with multiple functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In this specification, a circle, oval, triangle, rectangle, trapezoid, pentagon or hexagon, etc. is not strictly speaking, but may be an approximate circle, oval, triangle, rectangle, trapezoid, pentagon or hexagon, etc. Some small deformations due to tolerances may exist, for example, guide angles, curved edges and deformations thereof may exist.

In the specification, "about" and "substantially" refer to that a boundary is not defined strictly and a case within a process and measurement error range is allowed. In the present disclosure, "substantially the same" refers to a case where numerical values differ by less than 10%.

In the present specification, "A extends along a B direction" means that A may include a main portion and a secondary portion connected to the main portion, the main portion is a line, a line segment, or a strip-shaped body, the main portion extends along the B direction, and a length of the main portion extending along the B direction is greater than a length of the secondary portion extending along another direction. "A extends in a B direction" in the present specification always means "a main portion of A extends in a B direction".

"A and B are of a same layer structure" mentioned in the present specification means that A and B are formed simultaneously through a same patterning process. A "same layer" does not always mean that thicknesses of layers or heights of layers are the same in a section diagram. "An orthographic projection of A contains an orthographic projection of B" means that the orthographic projection of B falls within a range of the orthographic projection of A, or the orthographic projection of A covers the orthographic projection of B.

In order to better meet people's demands for various functions and better screen experience (for example, a display screen with ultra-high screen ratio), the design of narrow bezel display screen has gradually become the mainstream form of display equipments. However, in some implementations, the arrangement of partial signal lines and circuits within the display panel leads to a result in which the display panel cannot achieve a narrow bezel.

An embodiment of the present disclosure provides a display substrate, which includes a display region and a bezel region located around the display region. The display substrate includes a base substrate, a plurality of data lines, a plurality of multiplexing circuits, a plurality of multiplexing data lines, a plurality of first electrostatic discharge circuits, a plurality of second electrostatic discharge circuits, and a plurality of first signal lines located on the base substrate. The plurality of data lines are located in the display region, and are configured to provide data signals for pixels of the display region. The plurality of multiplexing circuits, the plurality of multiplexing data lines, the plurality of first electrostatic discharge circuits, the plurality of second electrostatic discharge circuits, and the plurality of first signal lines are located in the bezel region. The plurality of multiplexing circuits are sequentially arranged along edges of the display region. The plurality of multiplexing circuits are electrically connected with the plurality of multiplexing data lines and the plurality of data lines. The plurality of first electrostatic discharge circuits are electrically connected to the plurality of multiplexing data lines, and the plurality of second electrostatic discharge circuits are electrically connected to the plurality of first signal lines. The plurality of first electrostatic discharge circuits and the plurality of second electrostatic discharge circuits are located at a side of the plurality of multiplexing circuits away from the display region, and a plurality of second electrostatic discharge circuits are interspersed in the plurality of first electrostatic discharge circuits.

The display substrate provided by this embodiment can reduce the arrangement space occupied by the second electrostatic discharge circuit by optimizing the setting position of the second electrostatic discharge circuit, thereby facilitating the realization of a narrow bezel of the display substrate.

In some exemplary implementations, the bezel region may include a first bezel region located at a side of the display region along the second direction. The plurality of multiplexing circuits are located in the first bezel region and arranged side by side along the first direction, and the first direction intersects with the second direction. In the present example, by arranging the multiplexing circuits side by side in the first bezel region along the first direction, the arrangement space occupied by the multiplexing circuits can be reduced, thereby facilitating the realization of a narrow bezel of the display substrate.

In some exemplary implementations, the display substrate may have a first centerline which may be parallel to the second direction. The plurality of second electrostatic discharge circuits may be located in a region, close to the first centerline, within the first bezel region and in an edge region, away from the first centerline, within the first bezel region. In some examples, the display substrate is symmetrically distributed with the first centerline as the symmetrical axis. The arrangement of the second electrostatic discharge circuit of this example is beneficial to the electrostatic discharge of the corresponding trace.

In some exemplary implementations, the bezel region may further include a second bezel region located at a side of the display region away from the first bezel region along the second direction. The display substrate may also include a plurality of test circuits located in the second bezel region, and the plurality of test circuits may be arranged side by side along the first direction. In this example, by arranging the test circuits side by side in the second bezel region along the first direction, the arrangement space occupied by the test circuits can be reduced, thereby facilitating the realization of a narrow bezel of the display substrate.

In some exemplary implementations, the bezel region further includes a third bezel region and a fourth bezel region located at opposite sides of the display region along the first direction, a first corner region connecting the first bezel region and the third bezel region, a second corner region connecting the third bezel region and the second bezel region, a third corner region connecting the second bezel region and the fourth bezel region, and a fourth corner region connecting the fourth bezel region and the first bezel region. The display substrate may further include a gate drive circuit which may be located in the third bezel region, the fourth bezel region, the first corner region, the second corner region, the third corner region, and the fourth corner region. In this example, the gate drive circuit may be provided in a plurality of corner regions, and the test circuit and the multiplexing circuit are not provided in the corner regions, which may facilitate the reduction of the size of the corner regions and the narrowing of the corner regions.

Solutions of the embodiments will be described below through some examples.

FIG. 1 is a schematic diagram of a display panel according to at least one embodiment of the present disclosure. In some examples, the display panel may be a closed polygon including linear sides, such as a rectangular rounded shape. For example, at least some corners of the display panel may be curves when the display panel has linear sides. A part at an intersection of close to linear sides may be replaced with a curve with a predetermined curvature when the display panel has a rectangular shape. Among them, the curvature may be set according to different positions of the curve. For example, the curvature may be changed according to a starting position of the curve, a length of the curve, etc. However, the embodiment is not limited thereto. For example, the display panel may be circular or elliptical including curved sides or semicircular or semi-elliptical including linear sides and curved sides and the like.

In some examples, as shown in FIG. 1, the display panel may include a display substrate. The display substrate may include a display region AA and a bezel region located around the display region AA. For example, the display region AA may include a first edge (lower edge) and a second edge (upper edge) oppositely disposed in the second direction Y, and a third edge (left edge) and a fourth edge (right edge) oppositely disposed in the first direction X. The first edge and the second edge may be linear edges parallel to each other, and the third edge and the fourth edge may be linear edges parallel to each other. Adjacent linear edges can be connected by curved edges.

In some examples, as shown in FIG. 1, the bezel region may include a first bezel region (lower bezel) B1 and a second bezel region (upper bezel) B2 that are oppositely disposed in the second direction Y, and a third bezel region (left bezel) B3 and a fourth bezel region (right bezel) B4 that are oppositely disposed in the first direction X. The first bezel region B1 is adjacent to the first edge of the display region AA, the second bezel region B2 is adjacent to the second edge of the display region AA, the third bezel region B3 is adjacent to the third edge of the display region AA, and the fourth bezel region B4 is adjacent to the fourth edge of the display region AA. The first bezel region B1 may be connected with the third bezel region B3 through the first corner region C1, and may also be connected with the fourth bezel region B4 through the fourth corner region C4. The second bezel region B2 may be connected with the third bezel region B3 through the second corner region C2, and may also be connected with the fourth bezel region B4 through the third corner region C3. The first corner regions C1 to the fourth corner regions C4 each correspond to an arc-shaped edge of the display region AA. The edges of the first corner region C1 to the fourth corner region C4 at a side away from the display region AA may all be curved edges.

In some examples, as shown in FIG. 1, the display region AA of the display substrate may at least include a plurality of pixel circuits, a plurality of gate lines, and a plurality of data lines. The display panel may further include light emitting elements (i.e. sub-pixel) Px located in the display region AA of the display substrate. The light emitting elements Px may be arranged in an array. The plurality of gate lines may extend along the first direction X, and the plurality of data lines may extend along the second direction Y. An orthographic projection of the plurality of gate lines on the base substrate may intersect with an orthographic projection of the plurality of data lines on the substrate to form a plurality of circuit regions, and one pixel circuit may be provided in each circuit region. The plurality of data lines are electrically connected with a plurality of pixel circuits and may be configured to provide data signals to the plurality of pixel circuits. The plurality of gate lines are electrically connected with the plurality of pixel circuits and may be configured to provide gate control signals to the plurality of pixel circuits. In some examples, the gate control signal may include a scan signal or may include a scan signal and a light emitting control signal.

In some examples, as shown in FIG. 1, the first direction X may be an extension direction (row direction of sub-pixels) of the gate lines in the display region AA, and the second direction Y may be an extension direction (column direction of sub-pixels) of the data lines in the display region AA. The first direction X and the second direction Y may be perpendicular to each other.

In some examples, a pixel unit of the display region AA may include three sub-pixels which are a red sub-pixel, a green sub-pixel, and a blue sub-pixel respectively. However, the embodiment is not limited thereto. In some examples, one pixel unit may include four sub-pixels, and the four sub-pixels are a red sub-pixel, a green sub-pixel, a blue sub-pixel, and a white sub-pixel respectively.

In some examples, a shape of a sub-pixel may be a rectangle, a rhombus, a pentagon, or a hexagon. When one pixel unit includes three sub-pixels, the three sub-pixels may be arranged in parallel in a horizontal direction, in parallel in a vertical direction, or in a delta-shaped form. When one pixel unit includes four sub-pixels, the four sub-pixels may be arranged in parallel in a horizontal direction, in parallel in a vertical direction, or in a square. However, the embodiment is not limited thereto.

In some examples, the pixel circuit may be configured to drive the connected light emitting element. The pixel circuit may include multiple transistors and at least one capacitor. For example, the pixel circuit may be a circuit of a 3T1C, 4T1C, 5T1C, 5T2C, 6T1C, 7T1C, or 8T1C structure. Among them, in the above circuit structure, T refers to a thin film transistor, C refers to a capacitor, a number before T represents a quantity of thin film transistors in the circuit, and a number before C represents a quantity of capacitors in the circuit. In some examples, the plurality of transistors in the pixel circuit may be P-type transistors or may be N-type transistors. Adopting a same type of transistors in the pixel circuit may simplify a process flow, reduce process difficulties of the display panel, and improve a yield of products. In other examples, the plurality of transistors in the pixel circuit may include a P-type transistor and an N-type transistor.

In some examples, low temperature poly silicon thin film transistors, or oxide thin film transistors, or a low temperature poly silicon thin film transistor and an oxide thin film transistor may be adopted for the plurality of transistors in the pixel circuit. Low Temperature Poly Silicon (LTPS) is adopted for an active layer of a low temperature poly silicon thin film transistor and an oxide semiconductor (Oxide) is adopted for an active layer of an oxide thin film transistor. The low temperature poly silicon thin film transistor has advantages such as a high migration rate and fast charging, and the oxide thin film transistor has advantages such as a low leakage current. The low temperature poly silicon thin film transistor and the oxide thin film transistor are integrated on one display panel, that is, an LTPS+Oxide (LTPO for short) display panel, so that advantages of both the low temperature poly silicon thin film transistor and the oxide thin film transistor may be utilized, low-frequency drive may be achieved, power consumption may be reduced, and display quality may be improved.

In some examples, the light emitting element may be any one of a Light Emitting Diode (LED), an Organic Light emitting Diode (OLED), a Quantum dot Light emitting Diode (QLED), a Micro LED (including a mini-LED or a micro-LED) and the like. For example, the light emitting element may be an OLED, and the light emitting element may emit red light, green light, blue light, or white light, etc. under drive of a pixel circuit corresponding to the light emitting element. A color of light emitted by the light emitting element may be determined as required. In some examples, the light emitting element may include an anode, a cathode, and an organic emitting layer located between the anode and the cathode. The anode of the light emitting element may be electrically connected with a corresponding pixel circuit. However, the embodiment is not limited thereto.

Figure 2:
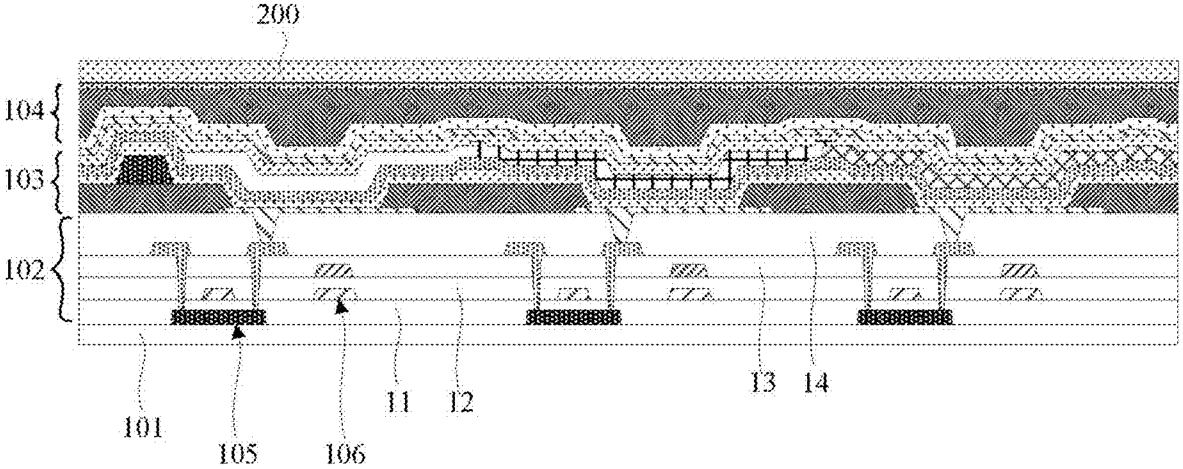
FIG. 2 is a schematic diagram of a partial sectional structure of a display region according to at least one embodiment of the present disclosure.

FIG. 2 is a schematic diagram of a partial sectional structure of a display region according to at least one embodiment of the present disclosure. FIG. 2 illustrates structures of three sub-pixels of the display panel. In some examples, as shown in FIG. 2, in a direction perpendicular to the display substrate, the display panel may include a base substrate 101, and a circuit structure layer 102, a light emitting structure layer 103, an encapsulation structure layer 104, and an encapsulation cover plate 200 which are sequentially disposed on the base substrate 101. The encapsulation cover plate 200 may be a glass cover plate, for example. In some possible implementation modes, the display panel may include other film layers, such as a post spacer, which is not limited here in the present disclosure.

In some examples, the base substrate 101 may be a rigid underlay substrate, e.g., a glass underlay substrate. However, the embodiment is not limited thereto. For example, the base substrate may be a flexible underlay substrate, e.g., prepared from an insulation material like a resin. In addition, the base substrate may be a single-layer structure or a multilayer structure. When the base substrate is a multilayer structure, an inorganic material such as silicon nitride, silicon oxide, and silicon oxynitride may be arranged between a plurality of layers as a single layer or multiple layers.

In some examples, the circuit structure layer 102 may include a plurality of transistors and a storage capacitor which form a pixel circuit. Illustration is made in FIG. 2 by taking each pixel circuit including one transistor and one storage capacitor as an example. In some possible implementations, the circuit structure layer 102 may include: an active layer disposed on the base substrate 101; a first insulation layer 11 covering the active layer; a first gate metal layer (including, for example, a gate electrode and a first capacitor electrode) disposed on the first insulation layer 11; a second insulation layer 12 covering the first gate metal layer; a second gate metal layer (e.g. including a second capacitor electrode) disposed on the second insulation layer 12; a third insulation layer 13 covering the second gate metal layer, wherein the first insulation layer 11, the second insulation layer 12 and the third insulation layer 13 are provided with vias, and the vias expose the active layer; a first source-drain metal layer (including, for example, a source electrode and a drain electrode of a transistor) disposed on the third insulation layer 13, wherein the source electrode and the drain electrode may be connected to the active layer through a via, respectively; and a first planarization layer 14 covering the structure, wherein the first planarization layer 14 is provided with a via, the via exposes the drain electrode. The active layer, the gate electrode, the source electrode, and the drain electrode may form the transistor 105, and the first capacitance electrode and the second capacitance electrode may form the storage capacitor 106.

In some examples, as shown in FIG. 2, the light emitting structure layer 103 may include an anode layer, a pixel definition layer, an organic emitting layer, and a cathode. The anode layer may include an anode of the light emitting element, the anode is disposed on the planarization layer and is connected with the drain electrode of the transistor of the pixel circuit through a via provided on the planarization layer; the pixel definition layer is disposed on the anode and the planarization layer, and a pixel opening is provided on the pixel definition layer and exposes the anode; the organic light emitting layer is at least partially disposed in the pixel opening and is connected with the anode; the cathode is disposed on the organic light emitting layer and is connected with the organic light emitting layer; and the organic light emitting layer emits light of a corresponding color under drive of the anode and the cathode.

In some examples, as shown in FIG. 2, the encapsulation structure layer 104 may include a first encapsulation layer, a second encapsulation layer, and a third encapsulation layer that are stacked. The first encapsulation layer and the third encapsulation layer may be made of an inorganic material, and the second encapsulation layer may be made of an organic material. The second encapsulation layer is arranged between the first encapsulation layer and the third encapsulation layer, which may ensure that outside vapor cannot enter the light light-emitting structure layer 103.

In some examples, the organic light emitting layer may at least include a hole injection layer, a hole transport layer, a light emitting layer and a hole block layer which are stacked on the anode. In some examples, the hole injection layers of all sub-pixels may be a common layer connected together; the hole transport layers of all sub-pixels may be a common layer connected together; the light emitting layers of close to sub-pixels may be slightly overlapped or isolated; and the hole block layers may be a common layer connected together. However, the embodiment is not limited thereto.

Figure 3:
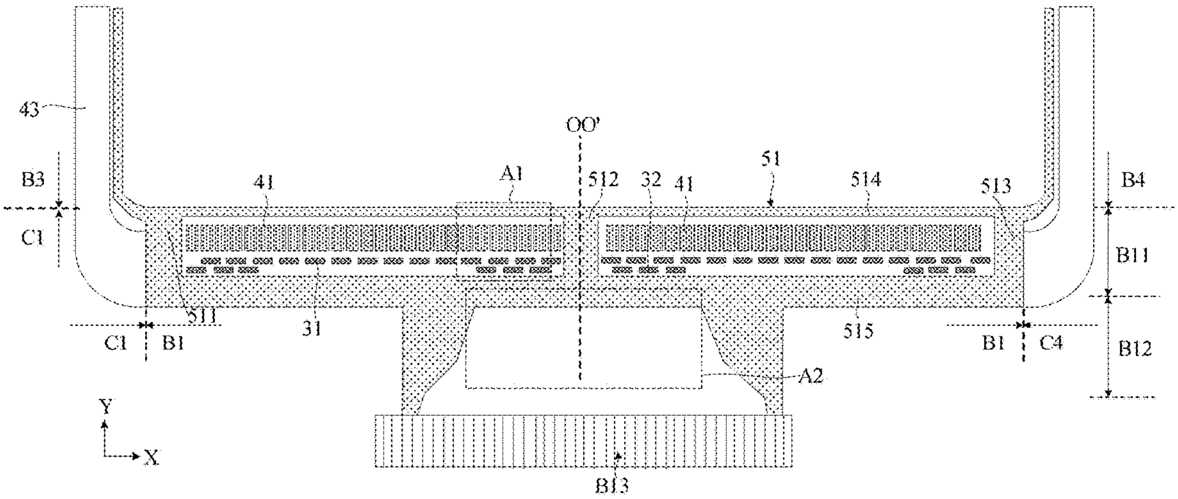
FIG. 3 is a partial schematic diagram of a bezel region according to at least one embodiment of the present disclosure.

FIG. 3 is a partial schematic diagram of a bezel region according to at least one embodiment of the present disclosure. In some examples, as shown in FIG. 1 and FIG. 3, the first bezel region (lower bezel) B1 of the display substrate may at least include a signal access region B13 located at a side of the display region AA, and a first region located between the signal access region B13 and the display region AA. The first region may include a peripheral circuit region B11 and an encapsulation region B12 that are sequentially disposed away from the display region AA in the second direction Y. The encapsulation region B12 may be a region where encapsulation adhesive is coated or printed. In some examples, the encapsulation region B12 may be an annular region surrounding the display region AA, thereby facilitating improvement of encapsulation effects.

In some examples, as shown in FIG. 1 and FIG. 3, the peripheral circuit region B11 of the first bezel region B1 may be provided with a plurality of multiplexing circuits 41, a plurality of first electrostatic discharge (ESD) circuits 31, and a plurality of second electrostatic discharge circuits 32. A plurality of multiplexing circuits 41 may be arranged side by side along the first direction X. The first electrostatic discharge circuit 31 and the second electrostatic discharge circuit 32 may be located at a side of the multiplexing circuit 41 away from the display region AA. Each multiplexing unit 41 may be electrically connected with a plurality of data lines in the display region AA and may be configured such that one signal source may provide data signals to the plurality of data lines. For example, each of the multiplexing circuits 41 may be electrically connected to one multiplexing data line through which a signal source providing a data signal may be electrically connected. The plurality of multiplexing data lines may be electrically connected the plurality of first static discharge circuits 31 in one-to-one correspondence so as to facilitate electrostatic discharge.

In some examples, the peripheral circuit region B11 may also be provided with a plurality of data fan-out lines. The plurality of data fan-out lines may be electrically connected to the plurality of data lines of the display region AA, and electrically connected to the multiplexing circuit 41 of the peripheral circuit region B11. For example, the plurality of data fan-out lines may be electrically connected to the plurality of data lines in one-to-one correspondence. The data line may be electrically connected to the multiplexing circuit 41 through the data fan-out line. The plurality of multiplexing data lines may extend to the signal access region B13 and are electrically and correspondingly connected to a plurality of first signal access pins within the signal access region B13. In some examples, the plurality of data fan-out lines may be of a same layer structure, for example, they may be located in the first gate metal layer.

In some examples, the peripheral circuit region B11 may also be provided with a plurality of first signal lines that may extend to the signal access region B13 and are electrically and correspondingly connected to a plurality of second signal access pins within the signal access region B13. The plurality of first signal lines may also extend through the first corner region C1 to the third bezel region B3 and the second corner region C2, and through the fourth corner region C4 to the fourth bezel region B4 and the third corner region C3. The first signal line may be electrically connected to the second static discharge circuit 32 for electrostatic discharge. For example, the first signal line may include a plurality of reset control lines, a plurality of drive signal lines, a test control line and a test data line.

In some examples, as shown in FIGS. 1 and 3, the third bezel region B3, the fourth bezel region B4, the first corner region C1 to the fourth corner region C4 may be provided with a gate drive circuit 43. The gate drive circuit 43 may include a plurality of drive units. For example, each drive unit may be configured to provide a scan signal to a row of sub-pixels within the display region AA. The plurality of drive units may be arranged in sequence along an edge extension direction of the display region AA. The drive signal line may be electrically connected to the gate drive circuit 43 to provide a drive signal (e.g. a clock signal, a start signal, a power supply signal, and the like) to the gate drive circuit.

In some examples, as shown in FIG. 1, the second bezel region B2 may be provided with a plurality of test circuits 42. The plurality of test circuits 42 may be sequentially arranged along the first direction X. Each test circuit 42 may be electrically connected to a plurality of data lines within the display region AA and may be configured to provide a test data signal to the plurality of data lines.

In some examples, as shown in FIG. 1 and FIG. 3, the bezel region is further provided with the first power supply line 51 and the second power supply line 52. The second power supply line 52 may be located at a side of the first power supply line 51 away from the display region AA. For example, the first power supply line 51 and the second power supply line 52 may surround the display region AA. An end of the second power supply line 52 in the first bezel region B1 may extend to the signal access region B13 and is electrically connected to the second power supply signal access pin in the signal access region B13.

In some examples, as shown in FIG. 3, the first power supply line 51 in the first bezel region B1 may include a first sub-power supply line 511, a second sub-power supply line 512, a third sub-power supply line 513, a fourth sub-power supply line 514, and a fifth sub-power supply line 515. The first power supply line 51 in the first bezel region B1 may have an integrated structure. The first sub-power supply line 511, the second sub-power supply line 512, and the third sub-power supply line 513 may all extend along the second direction Y. The fourth sub-power supply line 514 may extend along the first direction X and is electrically connected to the first sub-power supply line 511, the second sub-power supply line 512, and the third sub-power supply line 513, respectively. The fifth sub-power supply line 515 is located at a side of the fourth sub-power supply line 514 away from the display region. The fifth sub-power supply line 515 may have a body portion extending along the first direction X and a first extension portion and a second extension portion extending along the second direction Y. The first sub-power supply line 511, the second sub-power supply line 512, the third sub-power supply line 513, and the fourth sub-power supply line 514 may be located in the peripheral circuit region B11, and the fifth sub-power supply line 515 may be partially located in the peripheral circuit region B11 and partially located in the encapsulation region B12. The first extension portion and the second extension portion may extend from both sides of the first center line OO' to the signal access region B13 and are electrically connected to the first power supply signal access pin in the signal access region B13.

In some examples, as shown in FIG. 1 and FIG. 3, the fourth sub-power supply line 514 may be electrically connected to a plurality of first power connection lines of the display region to provide a first power supply signal to the sub-pixels of the display region. The second sub-power supply line 512 may be located at the first center line OO', the first sub-power supply line 511 and the third sub-power supply line 513 may be located at opposite sides of the first center line OO', the first sub-power supply line 511 may be close to the first corner region C1, and the third sub-power supply line 513 may be close to the fourth corner region C4. The first sub-circuit line 511 to the fifth sub-power supply line 515 are connected to form a first region and a second region, and the first region and the second region are located at opposite sides of the first center line OO'. The multiplexing circuit 41, the first electrostatic discharge circuit 31 and the second electrostatic discharge circuit 32 may be located within the first region and the second region. An end of the fourth sub-power supply line 514 may extend to the first corner region C1 and the third bezel region B3 along the edge extension direction of the display region, and the other end of the fourth sub-power supply line 514 may extend to the fourth corner region C4 and the fourth bezel region B4 along the edge extension direction of the display region.

In some examples, a portion of the fifth sub-power supply line 515 located within the encapsulation region B12, and a portion of the second power supply line 52 located within the encapsulation region B12 may serve as a first encapsulation adhesive underlay substrate. A plurality of openings can be provided on the first encapsulation adhesive underlay substrate. Since a plurality of openings are provided on the encapsulation adhesive underlay substrate, when a encapsulation adhesive is coated on the encapsulation adhesive underlay substrate, the encapsulation adhesive will leak into the openings, which is equivalent to having the encapsulation adhesive on and inside the encapsulation adhesive underlay substrate. Therefore, when the encapsulation adhesive is melted by laser, a bonding strength of the encapsulation adhesive can be further improved, and a bonding force between the base substrate and the encapsulation cover plate can be enhanced, thereby improving the product yield.

In this example, the first power supply signal can be transmitted to the side close to the display region AA through the first sub-power supply line 511, the second sub-power supply line 512 and the third sub-power supply line 513. The design of transmitting to the display region in three ways can effectively reduce the attenuation of the first power supply signal, can improve the current attenuation caused by the signal attenuation from bottom to top and from middle to both sides of the first power supply signal transmitted to the display region, can improve the brightness uniformity of the display region, and improve the display effect. Moreover, the design of the first power supply line is advantageous to support the sequential arrangement of the multiplexing circuits in the first bezel region along the first direction.

Figure 4:
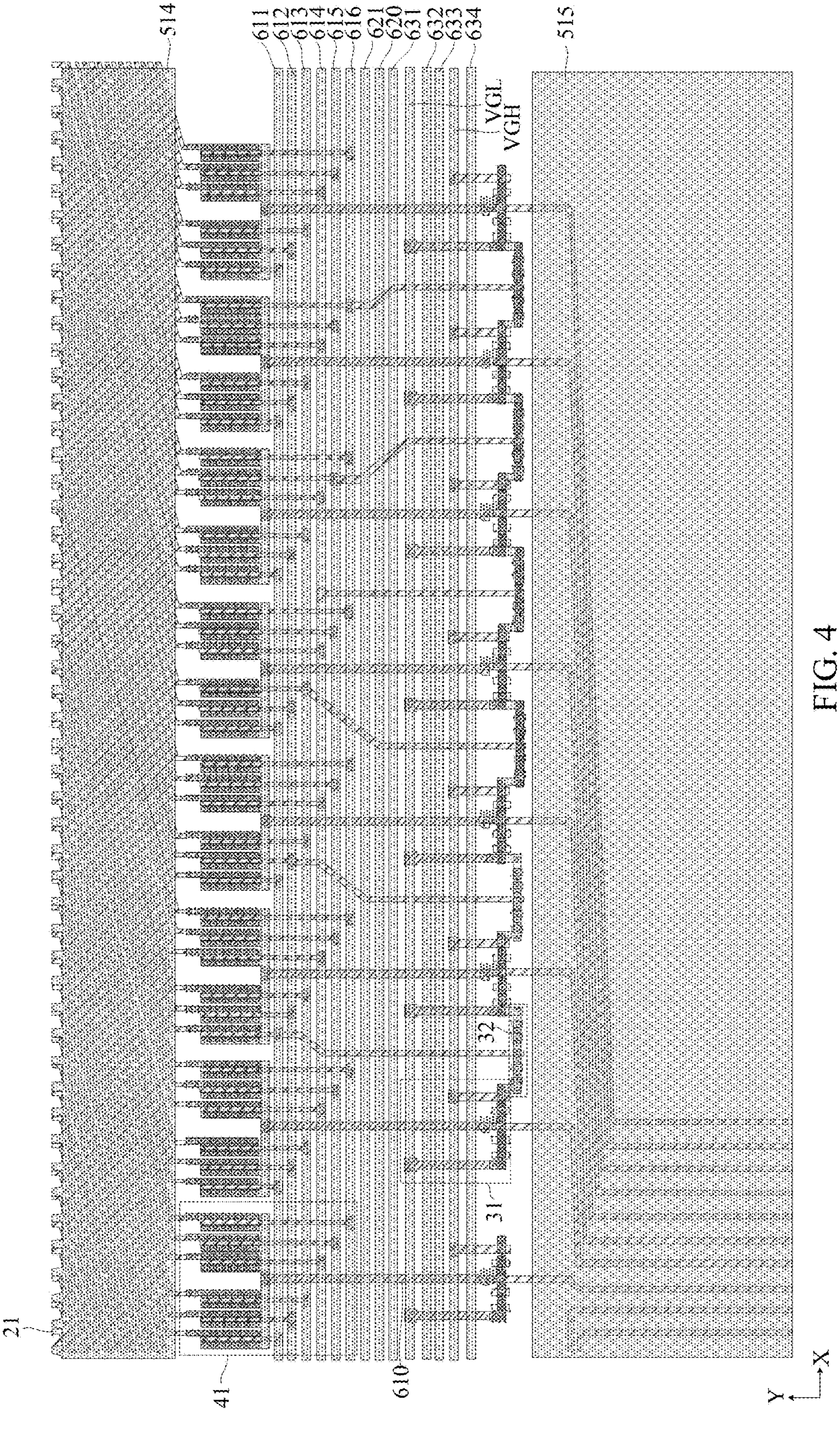
FIG. 4 is a schematic partial enlarged view of a region A1 in FIG. 3.

FIG. 4 is a schematic partial enlarged view of a region A1 in FIG. 3. In some examples, as shown in FIG. 4, in the first bezel region, a plurality of multiplexing circuits 41, a plurality of first electrostatic discharge circuits 31, and a plurality of second electrostatic discharge circuits 32 may be located in a region between a fourth sub-power supply line 514 and a fifth sub-power supply line 515 of the first power supply line. An orthographic projection of the fourth sub-power supply line 514 and an orthographic projection of the fifth sub-power supply line 515 on the base substrate may be not overlapped with orthographic projections of the multiplexing circuit 41, the first electrostatic discharge circuit 31 and the second electrostatic discharge circuit 32 on the base substrate. The first electrostatic discharge circuit 31 and the second electrostatic discharge circuit 32 may be located at a side of the multiplexing circuit 41 away from the display region. The multiplexing circuit 41 and the first static discharge circuit 31 may be electrically connected through the multiplexing data line. The second electrostatic discharge circuit 32 may be interposed between the plurality of first electrostatic discharge circuits 31. For example, one second electrostatic discharge circuit 32 may be provided between two adjacent first electrostatic discharge circuits 31. The second electrostatic discharge circuit 32 may be located at a side of the first electrostatic discharge circuit 31 away from the display region.

In some examples, as shown in FIG. 4, the first bezel region may also be provided with a plurality of multiplexing control lines (e.g. a first multiplexing control line 611 to a sixth multiplexing control line 616), a test control line 620, a first test data line (e.g. a first test data line 621), a plurality of drive signal lines (e.g. including a start signal line 631, a first clock signal line 632, a second clock signal line 633, a drive output line 634, a third power supply line VGH, and a fourth power supply line VGL). For example, the first test data line 621 and the test control line 620 may extend through the first corner region, the third bezel region and the second corner region to be electrically connected to the test circuit within the second bezel region. The start signal line 631, the first clock signal line 632, the second clock signal line 633, the drive output line 634, the third power supply line VGH, and the fourth power supply line VGL may be electrically connected to the gate drive circuit. The start signal line 631 may be configured to provide a start signal to the gate drive circuit, the first clock signal line 632 may be configured to provide a first clock signal to the gate drive circuit, the second clock signal line 633 may be configured to provide a second clock signal to the gate drive circuit, the third power supply line VGH may be configured to provide a third power supply signal to the gate drive circuit, and the fourth power supply line VGL may be configured to provide a fourth power supply signal to the gate drive circuit. For example, a voltage value of the third power supply signal may be greater than a voltage value of the fourth power supply signal. The gate drive circuit may include, for example, a plurality of cascaded drive units. The start signal line 631 may be electrically connected to the drive unit at the first stage. The drive output line 634 may be electrically connected to a drive unit at the last stage, and configured to transmit an output signal of the drive unit at the last stage to a control device to detect whether or not the gate drive circuit operates normally. At least part of line segments of the multiplexing control line may extend along the first direction X, and at least part of line segments of the drive signal line may extend along the first direction X. The plurality of multiplexing control lines, the first test data line 621, the test control line 620, and the plurality of drive signal lines may be sequentially arranged along the second direction Y. The plurality of multiplexing control lines may be located at a side of the multiplexing circuit away from the display region, and the plurality of drive signal lines may be located between the first electrostatic discharge circuit and the plurality of multiplexing control lines.

In some examples as shown in FIG. 3 and FIG. 4, the plurality of second electrostatic discharge circuit circuits 32 close to the first centerline may be electrically connected to the plurality of multiplexing control lines respectively to discharge static electricity of the plurality of multiplexing control lines. A plurality of second electrostatic discharge circuits 32 located at edges of the first bezel region away from the first centerline may be electrically connected to the plurality of drive signal lines respectively to discharge static electricity of the plurality of drive signal lines.

Figure 5:
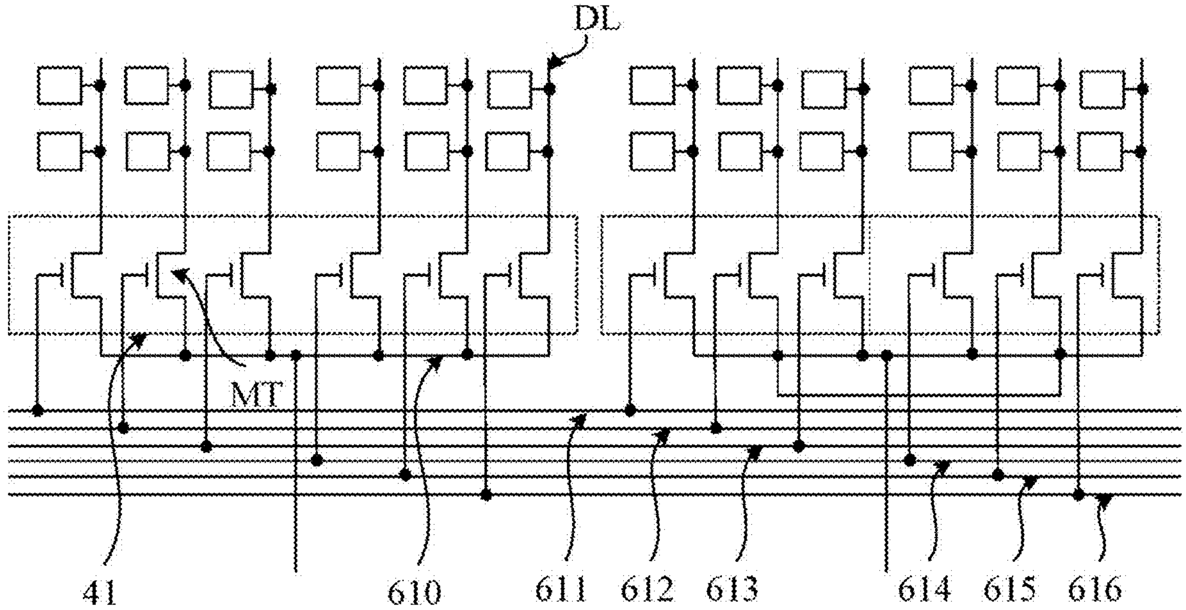
FIG. 5 is an equivalent circuit diagram of a multiplexing circuit according to at least one embodiment of the present disclosure.

FIG. 5 is an equivalent circuit diagram of a multiplexing circuit according to at least one embodiment of the present disclosure. In some examples, one multiplexing circuit may be electrically connected to a multiplexing control lines and one multiplexing data line, where a may be a positive integer greater than or equal to 2. Two multiplexing circuits are illustrated in FIG. 5, and each multiplexing circuit is electrically connected to six multiplexing control lines. Taking one of the multiplexing circuits in FIG. 5 as an example, the multiplexing circuit 41 may include six multiplexing transistors MT. The gates of the plurality of multiplexing transistors MT are respectively connected to different multiplexing control lines, namely, a gate of a first multiplexing transistor is connected to the first multiplexing control line 611, a gate of a second multiplexing transistor is connected to the second multiplexing control line 612, a gate of the third multiplexing transistor is connected to the third multiplexing control line 613, a gate of a fourth multiplexing transistor is connected to the fourth multiplexing control line 614, a gate of a fifth multiplexing transistor is connected to the fifth multiplexing control line 615, and a gate of a sixth multiplexing transistor is connected to the sixth multiplexing control line 616. First electrodes of the six multiplexing transistors MT are all connected to the same multiplexing data line (e.g. multiplexing data line 610). Second electrodes of the six multiplexing transistors MT are respectively connected with different data lines DL in the display region, that is, a second electrode of the first multiplexing transistor is connected with a data line DL in the display region, and a second electrode of the second multiplexing transistor is connected with another data signal line DL in the display region, and so on. During display process, a control apparatus provides a turn-on signal to the six multiplexing control lines in a time division manner, so that the six multiplexing transistors MT in each multiplexing circuit 41 are turned on at different time; when any one of the multiplexing transistor MT is turned on, the multiplexing data line supplies the data signal required by a data line connected with the turn-on multiplexing transistor MT, and the data line writes the data signal into the corresponding sub-pixel.

In some examples, by providing the multiplexing circuit, one signal source (for example, a pin of the drive IC) may provide data signals to a plurality of data lines, which can greatly reduce the actual quantity of signal sources and simplify the product structure. In other examples, one multiplexing circuit 41 may include three multiplexing transistors controlling three data lines (i.e. one controls three).

Figure 6A:
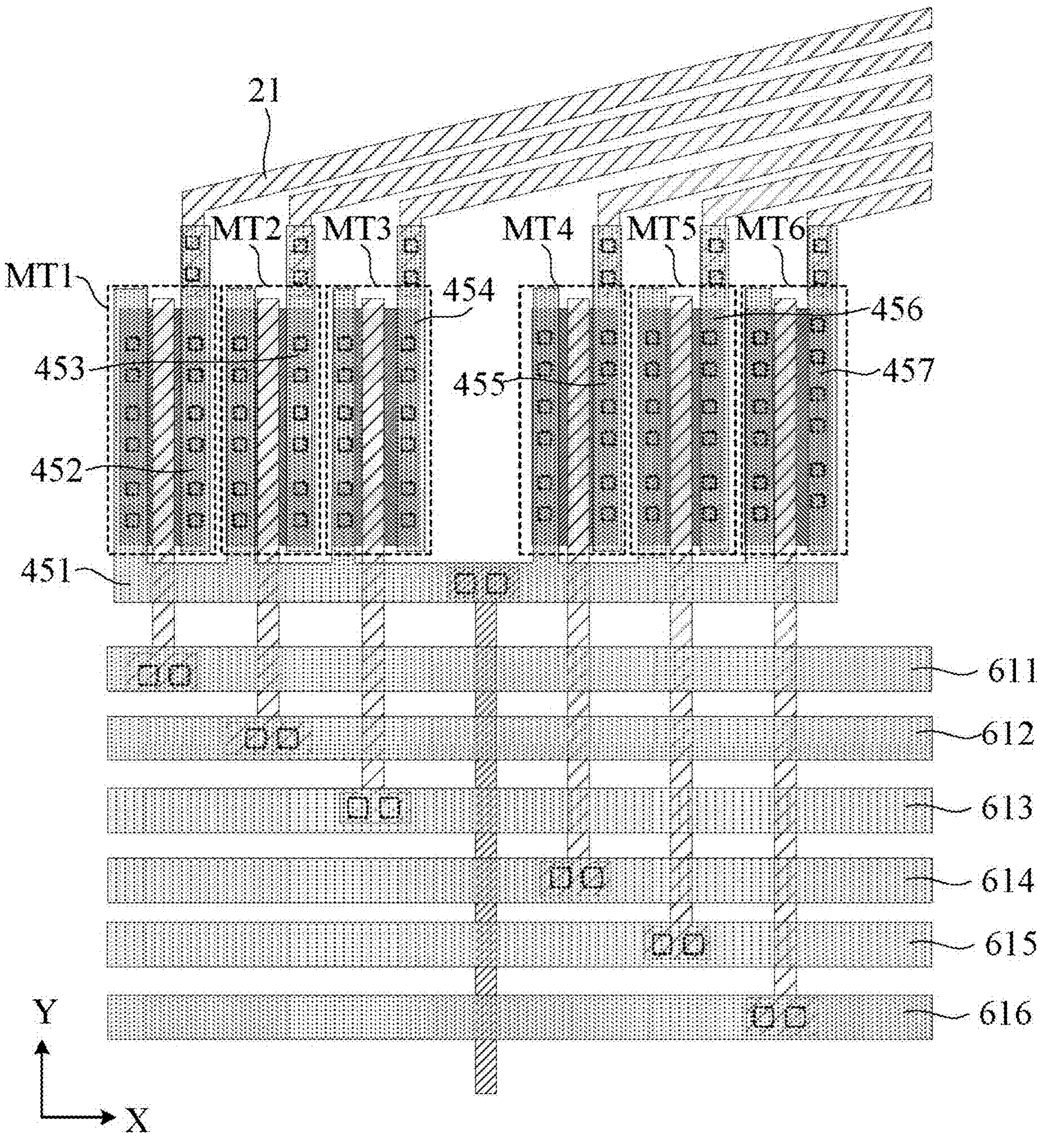
FIG. 6A is a schematic diagram of a structure of a multiplexing circuit according to at least one embodiment of the present disclosure.
Figure 6B:
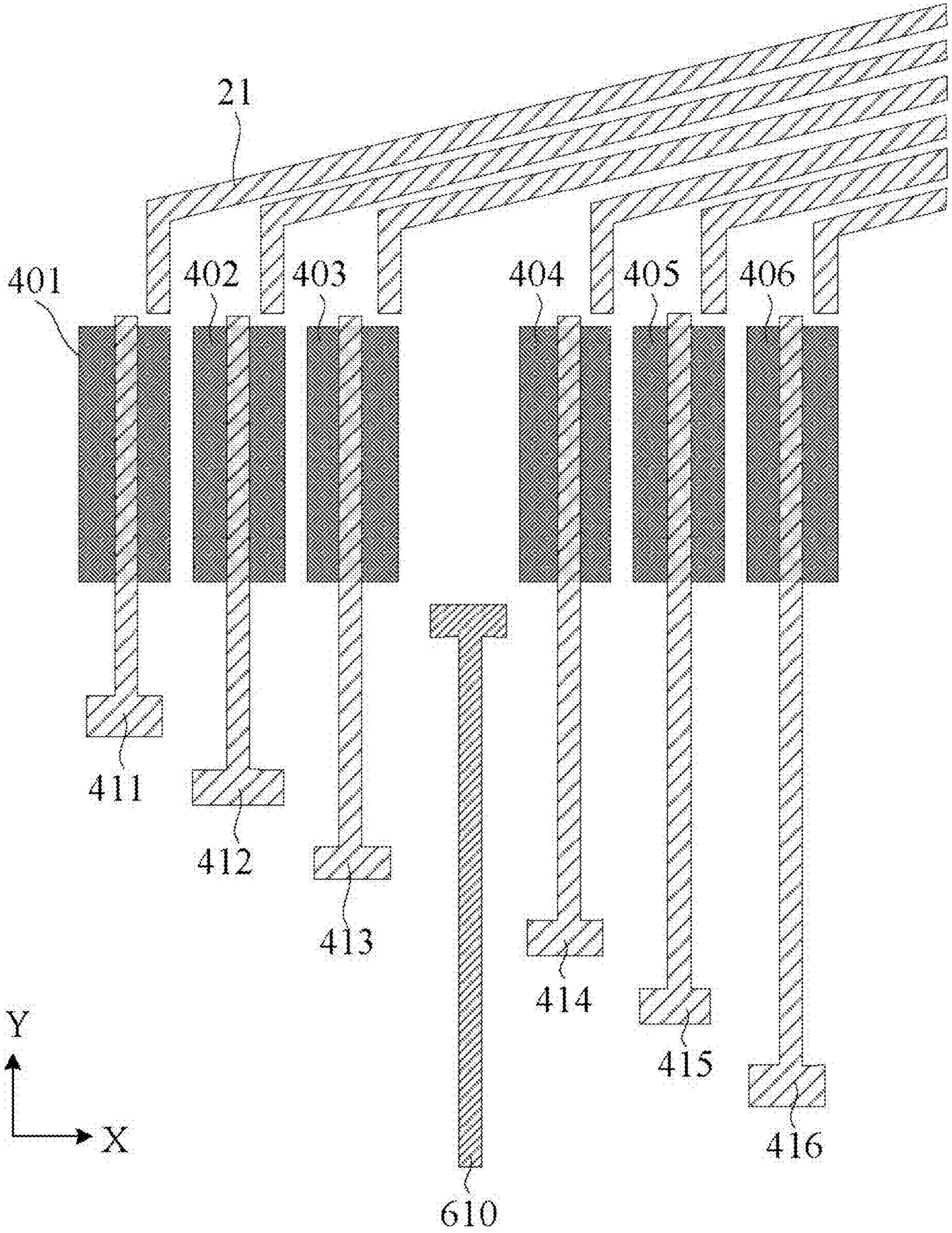
FIG. 6B is a schematic diagram of the multiplexing circuit after forming a second gate metal layer in FIG. 6A.
Figure 6C:
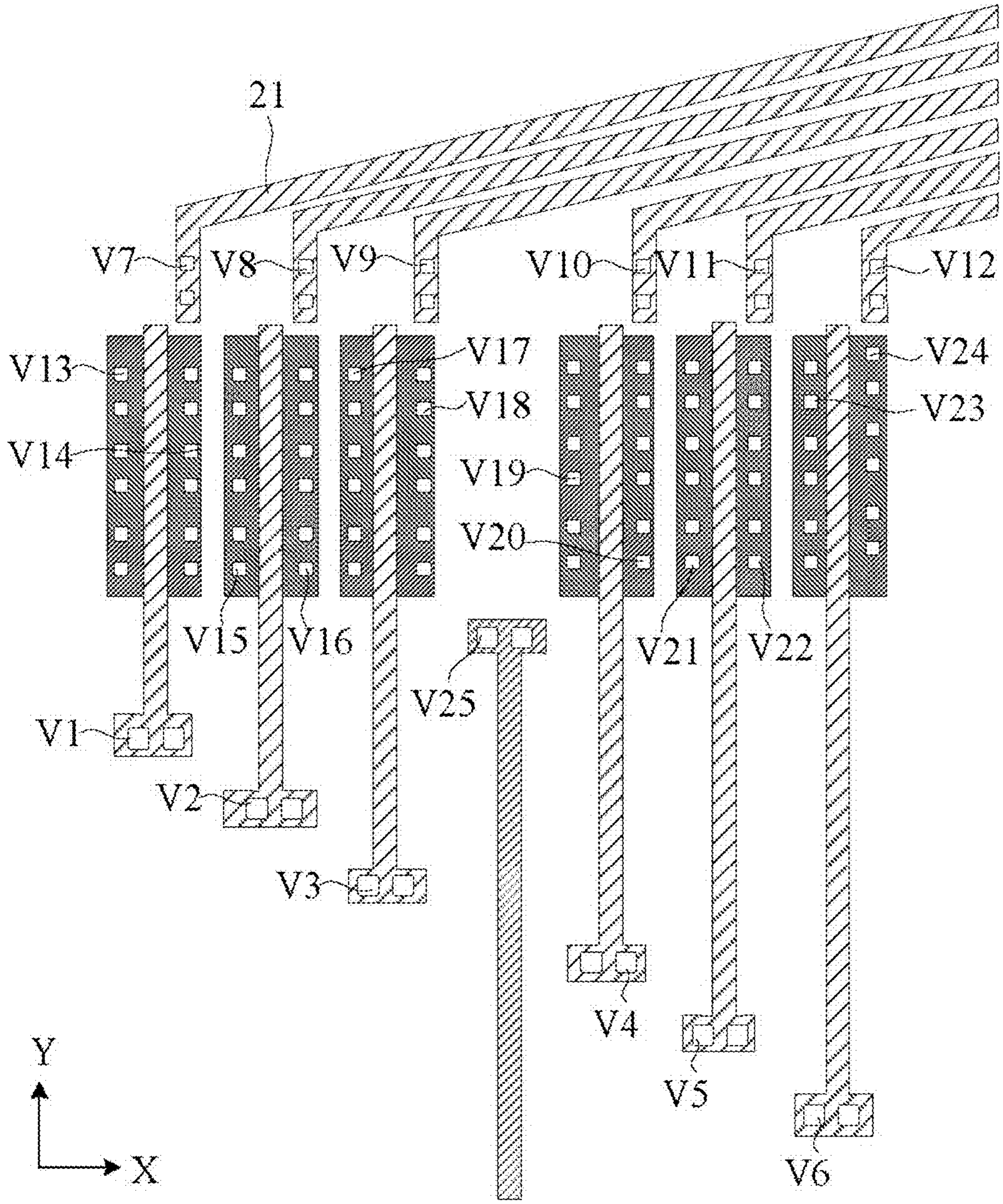
FIG. 6C is a schematic diagram of the multiplexing circuit after forming a third insulation layer in FIG. 6A.

FIG. 6A is a schematic diagram of a structure of a multiplexing circuit according to at least one embodiment of the present disclosure. FIG. 6B is a schematic diagram of the multiplexing circuit after forming a second gate metal layer in FIG. 6A. FIG. 6C is a schematic diagram of the multiplexing circuit after forming a third insulation layer in FIG. 6A. FIG. 6A is a schematic diagram of a multiplexing circuit after forming a first source-drain metal layer. In this example, one multiplexing circuit may include six multiplexing transistors (e.g. first multiplexing transistor MT1 to sixth multiplexing transistor MT6) arranged in sequence along the first direction X.

In some examples, as shown in FIG. 6B, an orthographic projection of the first active layer 401 of the first multiplexing transistor MT1, an orthographic projection of the second active layer 402 of the second multiplexing transistor MT2, an orthographic projection of the third active layer 403 of the third multiplexing transistor MT3, an orthographic projection of the fourth active layer 404 of the fourth multiplexing transistor MT4, an orthographic projection of the fifth active layer 405 of the fifth multiplexing transistor MT5, and an orthographic projection of the sixth active layer 406 of the sixth multiplexing transistor MT6 on the base substrate may be rectangular, and can be sequentially arranged along the first direction X.

In some examples, as shown in FIG. 6B, a first gate metal layer of the multiplexing circuit may include gates of a plurality of multiplexing transistors and a plurality of data fan-out lines 21. The first gate electrode 411 of the first multiplexing transistor MT1, the second gate electrode 412 of the second multiplexing transistor MT2, the third gate electrode 413 of the third multiplexing transistor MT3, the fourth gate electrode 414 of the fourth multiplexing transistor MT4, the fifth gate electrode 415 of the fifth multiplexing transistor MT5, and the sixth gate electrode 416 of the sixth multiplexing transistor MT6 may be sequentially arranged along the first direction X, and a length may be gradually increased along the second direction Y. The plurality of data fan-out lines 21 may be arranged in sequence along the first direction X. The data fan-out line 21 may extend toward a side of the display region, so as to be electrically connected to the data line of the display region. The plurality of data fan-out lines 21 may be electrically connected to a plurality of data lines in the display region in one-to-one correspondence.

In some examples, as shown in FIG. 6B, the second gate metal layer of the multiplexing circuit may include the multiplexing data line 610. The multiplexing data line 610 may be located at a side of the active layer of the multiplexing transistor away from the display region. In other examples, the multiplexing data line 610 may be located in the first gate metal layer.

In some examples as shown in FIG. 6C, the third insulation layer of the first bezel region is provided with a plurality of vias, which may include, for example, a first via V1 to a twenty-fifth via V25. The third insulation layer and the second insulation layer within the first via V1 to the twelfth via V12 can be removed to expose a surface of the first gate metal layer of the multiplexing circuit. The third insulation layer, the second insulation layer, and the first insulation layer within the thirteenth through twenty-fourth via V13 can be removed to expose a surface of the active layers of the plurality of multiplexing transistors of the multiplexing circuit. The third insulation layer in the twenty-fifth via V25 is removed to expose a surface of the second gate metal layer.

In some examples as shown in FIG. 6A, the first source-drain metal layer of the multiplexing circuit may include first electrodes and second electrodes of the six multiplexing transistors, a first multiplexing control lines 611 to a sixth multiplexing control lines 616. The first electrode of the first multiplexing transistor MT1, the first electrode of the second multiplexing transistor MT2, the first electrode of the third multiplexing transistor MT3, the first electrode of the fourth multiplexing transistor MT4, the first electrode of the fifth multiplexing transistor MT5, and the first electrode of the sixth multiplexing transistor MT6 may form an integrated structure. For example, as shown in FIGS. 6A to 6C, the first electrode 451 of the first multiplexing transistor MT1 may be electrically connected to the first active layer 401 through six thirteenth vias V13 arranged vertically, to the second active layer 402 through six fifteenth vias V15 arranged vertically, to the third active layer 403 through six seventeenth vias V17 arranged vertically, to the fourth active layer 404 through six nineteenth vias V19 arranged vertically, to the fifth active layer 405 through six twenty-first vias V21 arranged vertically, to the sixth active layer 406 through six twenty-third vias V23 arranged vertically, and to the multiplexing data line 610 through two twenty-fifth vias V25 arranged horizontally.

In some examples as shown in FIG. 6A to FIG. 6C, the second electrode 452 of the first multiplexing transistor MT1 may be electrically connected with the first active layer 401 through six fourteenth vias V14 arranged vertically, and it may also be electrically connected with the first data fan-out line 21 through the seventh via V7. The second electrode 453 of the second multiplexing transistor MT2 may be electrically connected with the second active layer 402 through six sixteenth vias V16 arranged vertically, and it may also be electrically connected with the second data fan-out line 21 through the eighth via V8. The second electrode 454 of the third multiplexing transistor MT3 may be electrically connected with the third active layer 403 through six eighteenth vias V18 arranged vertically, and it may also be electrically connected with the third data fan-out line 21 through the ninth via V9. The second electrode 455 of the fourth multiplexing transistor MT4 may be electrically connected with the third active layer 404 through six twentieth vias V20 arranged vertically, and it may also be electrically connected with the fourth data fan-out line 21 through the tenth via V10. The second electrode 456 of the fifth multiplexing transistor MT5 may be electrically connected with the fifth active layer 405 through six twenty-second vias V22 arranged vertically, and it may also be electrically connected with the fifth data fan-out line 21 through the eleventh via V11. The second electrode 457 of the sixth multiplexing transistor MT6 may be electrically connected with the sixth active layer 406 through six twenty-forth vias V24 arranged vertically, and it may also be electrically connected with the sixth data fan-out line 21 through the twelfth via V12.

In some examples as shown in FIG. 6A to FIG. 6C, the first gate electrode 411 of the first multiplexing transistor MT1 may be electrically connected with a first reset control line 611 through two first vias V1 arranged horizontally. The second gate electrode 412 of the second multiplexing transistor MT2 may be electrically connected with a second reset control line 612 through two second vias V2 arranged horizontally. The third gate electrode 413 of the third multiplexing transistor MT3 may be electrically connected with a third reset control line 613 through two third vias V3 arranged horizontally. The fourth gate electrode 414 of the fourth multiplexing transistor MT4 may be electrically connected with a fourth reset control line 614 through two forth vias V4 arranged horizontally. The fifth gate electrode 415 of the fifth multiplexing transistor MT5 may be electrically connected with a fifth reset control line 615 through two fifth vias V5 arranged horizontally. The sixth gate electrode 416 of the sixth multiplexing transistor MT6 may be electrically connected with a sixth reset control line 616 through two sixth vias V6 arranged horizontally.

In this example, the multiplexing transistors of the multiplexing circuit may be electrically connected to a plurality of data lines in the display region through the data fan-out line 21 located in the first gate metal layer. Since a parasitic capacitance per unit area where the first gate metal layer is overlapped with the first source-drain metal layer is less than a parasitic capacitance per unit area where the second gate metal layer is overlapped with the first source-drain metal layer, by disposing the data fan-out line in the first gate metal layer, the parasitic capacitance can be effectively reduced, thereby achieving the effect of reducing the load and optimizing the display effect.

In this example, the multiplexing circuits are not provided in the first corner region and the fourth corner region, and the multiplexing circuits are all provided in the first bezel region. The plurality of multiplexing circuits may be divided into two groups and disposed at opposite sides of the second sub-power supply line. By arranging the plurality of multiplexing circuits side by side in the first bezel region, and the interval between adjacent multiplexing circuits can be reduced, the occupied space of the multiplexing circuits can be reduced. No multiplexing circuit is provided in the first corner region and the fourth corner region, so that the drive unit of the gate drive circuit can be arranged close to a side of the display region, thereby greatly reducing the circular arc size of the outer edge of the first corner region and the fourth corner region, making the position of the outer edge of the first corner region and the fourth corner region closer to the display region, reducing the bezel size of the first corner region and the fourth corner region, and being beneficial to realizing the narrow bezel design of the display substrate.

Figure 7:
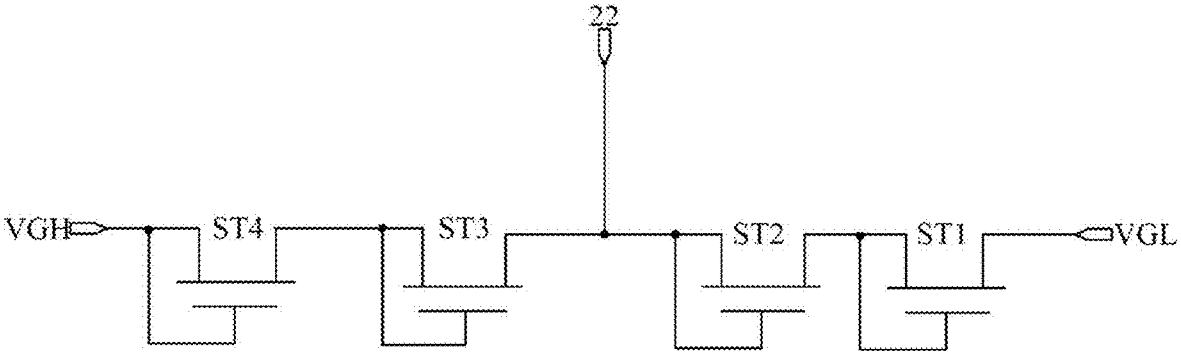
FIG. 7 is an equivalent circuit diagram of an electrostatic discharge circuit according to at least one embodiment of the present disclosure.

FIG. 7 is an equivalent circuit diagram of an electrostatic discharge circuit according to at least one embodiment of the present disclosure. In some examples, as shown in FIG. 7, at least one electrostatic discharge circuit is connected to one second signal line 22 and configured to discharge static electricity in the second signal line 22 connected thereto. For example, the second signal line to which the first electrostatic discharge circuit is connected may be a multiplexing data line, and the second signal line to which the second electrostatic discharge circuit is connected may be a drive signal line. One electrostatic discharge circuit may include a first discharge transistor ST1 to a fourth discharge transistor ST4. A first electrode of the first discharge transistor ST1 is electrically connected to the fourth power supply line VGL, a gate and a second electrode of the first discharge transistor ST1 are electrically connected to the first electrode of the second discharge transistor ST2, a gate and a second electrode of the second discharge transistor ST2 are electrically connected to the second signal line 22 corresponding to the electrostatic discharge circuit, a first electrode of the third discharge transistor ST3 is electrically connected to the second signal line 22 corresponding to the electrostatic discharge circuit, a gate and a second electrode of the third discharge transistor ST3 are electrically connected to a first electrode of the fourth discharge transistor ST4, and a gate and a second electrode of the fourth discharge transistor ST4 are electrically connected to the third power supply line VGH.

In an example, damage due to discharge breakdown caused by static electricity accumulation in the second signal line may be prevented by arrangement of the electrostatic discharge circuit, so as to discharge the static electricity accumulated in the second signal line and achieve the protection of the second signal line.

In another example, the electrostatic discharge circuit may include two discharge transistors, wherein one electrode of each discharge transistor is connected to its own gate, thereby forming an equivalent diode connection. A signal line to be protected is connected between the two "diodes", and another two terminals of the two "diodes" are respectively connected to the third power supply line VGH and the fourth power supply line VGL. Therefore, when an instantaneous high voltage (e.g., 100V) occurs due to accumulation of positive charges in the signal line, one of the "diodes" is turned on to discharge the positive charges in the signal line, and when an instantaneous low voltage (e.g., −100V) occurs due to accumulation of negative charges in the signal line, the other of the "diodes" is turned on to discharge the negative charges in the signal line.

Figure 8A:
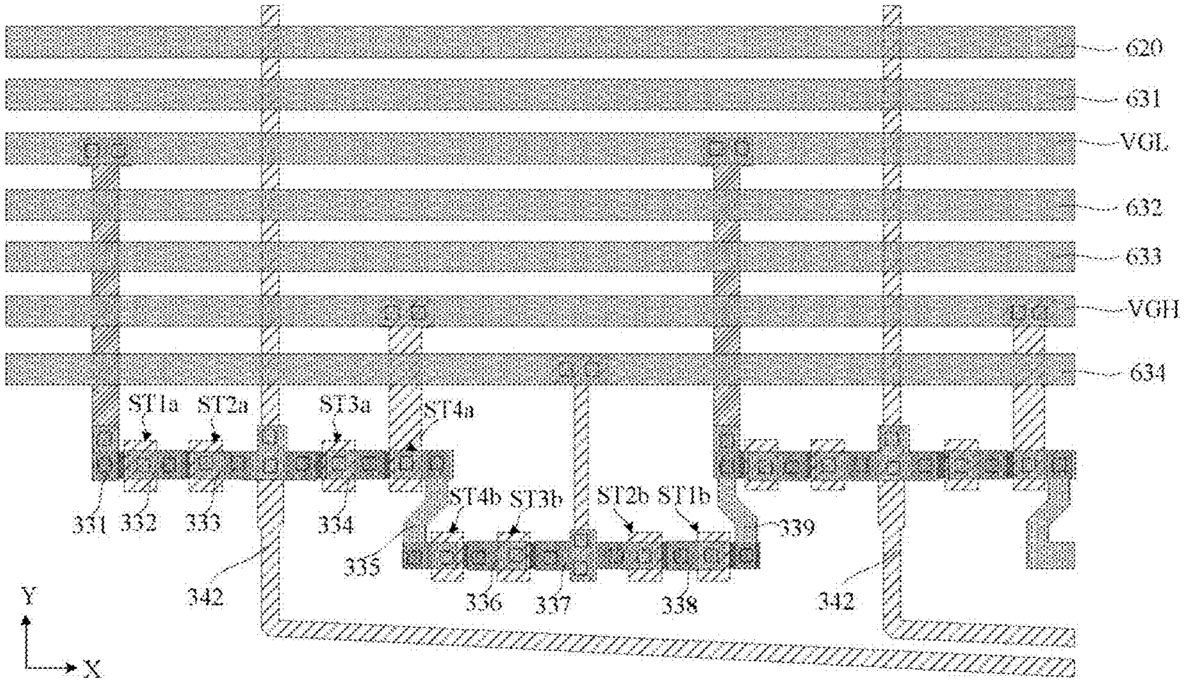
FIG. 8A is a schematic diagram of a structure of an electrostatic discharge circuit according to at least one embodiment of the present disclosure.
Figure 8B:
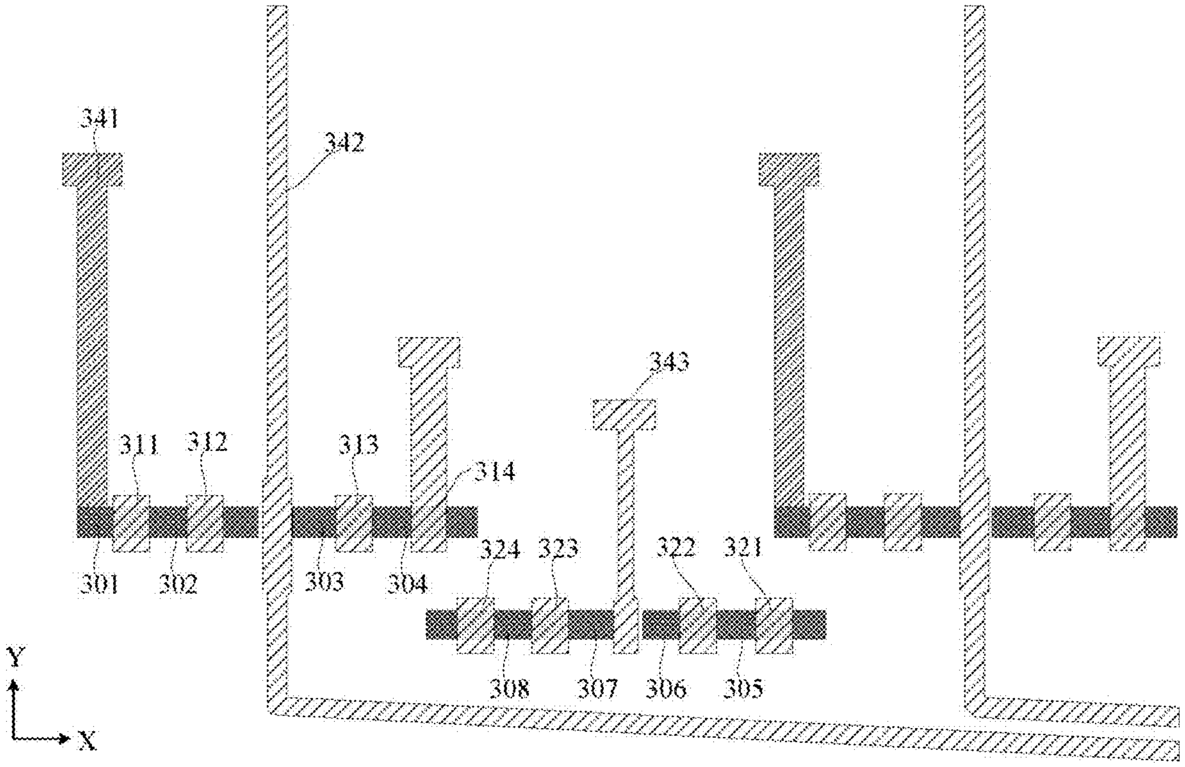
FIG. 8B is a schematic diagram of the electrostatic discharge circuit after forming a second gate metal layer in FIG. 8A.
Figure 8C:
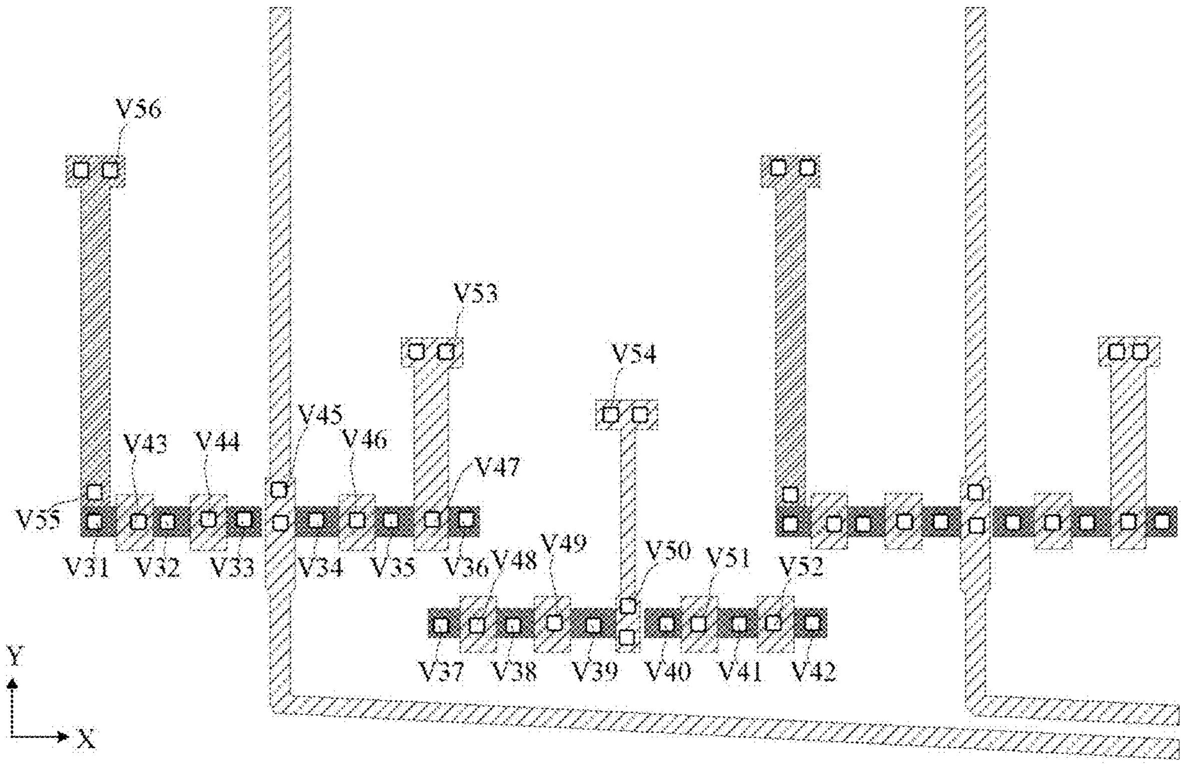
FIG. 8C is a schematic diagram of the electrostatic discharge circuit after forming a third insulation layer in FIG. 8A.

FIG. 8A is a schematic diagram of a structure of an electrostatic discharge circuit according to at least one embodiment of the present disclosure. FIG. 8B is a schematic diagram of the electrostatic discharge circuit after forming a second gate metal layer in FIG. 8A. FIG. 8C is a schematic diagram of the electrostatic discharge circuit after forming a third insulation layer in FIG. 8A. FIG. 8A is a schematic diagram of an electrostatic discharge circuit after forming a first source-drain metal layer. Two first electrostatic discharge circuits and one second electrostatic discharge circuit are illustrated in FIG. 8A to FIG. 8C as an example. Equivalent circuit diagrams of the first electrostatic discharge circuit and the second electrostatic discharge circuit are as shown in FIG. 7. For example, the first electrostatic discharge circuit may include a first discharge transistors ST1*a* to a fourth discharge transistor ST4*a*, and the second electrostatic discharge circuit may include a first discharge transistor ST1*b* to a fourth discharge transistor ST4*b*.

In some examples, as shown in FIG. 8A to FIG. 8B, orthographic projections of the first active layer 301 of the first discharge transistor ST1*a*, the second active layer 302 of the second discharge transistor ST2*a*, the third active layer 303 of the third discharge transistor ST3*a*, and the fourth active layer 304 of the fourth discharge transistor ST4*a* of the first electrostatic discharge circuit on the base substrate may be rectangular, and may be arranged in sequence along the first direction X. The first active layer 301 of the first discharge transistor ST1*a* and the second active layer 302 of the second discharge transistor ST2*a* may be an integral structure, and the third active layer 303 of the third discharge transistor ST3*a* and the fourth active layer 304 of the fourth discharge transistor ST4*a* may form an integrated structure. Orthographic projections of the first active layer 305 of the first discharge transistor ST1*b*, the second active layer 306 of the second discharge transistor ST2*b*, the third active layer 307 of the third discharge transistor ST3*b*, and the fourth active layer 308 of the fourth discharge transistor ST4*b* of the second electrostatic discharge circuit on the base substrate may be rectangular, and may be arranged in sequence along the first direction X. The arrangement directions of the four discharge transistors of the second electrostatic discharge circuit and the arrangement directions of the four discharge transistors of the first electrostatic discharge circuit may be opposite to each other. The first active layer 305 of the first discharge transistor ST1*b* and the second active layer 306 of the second discharge transistor ST2*b* may be an integral structure, and the third active layer 307 of the third discharge transistor ST3*b* and the fourth active layer 308 of the fourth discharge transistor ST4*b* may form an integrated structure.

In some examples, as shown in FIGS. 8A and 8B, the first gate metal layer of the electrostatic discharge circuit may further include gates of the plurality of discharge transistors of the first electrostatic discharge circuit (e.g., a gate 311 of the first discharge transistor ST1*a*, a gate 312 of the second discharge transistor ST2*a*, a gate 313 of the third discharge transistor ST3*a*, and a gate 314 of the fourth discharge transistor ST4*a*), gates of the plurality of discharge transistors of the second electrostatic discharge circuit (e.g., a gate 321 of the first discharge transistor ST1*b*, a gate 322 of the second discharge transistor ST2*b*, a gate 323 of the third discharge transistor ST3*b*, and a gate 324 of the fourth discharge transistor ST4*b*), a second connection line 342 and a third connection line 343. At least a portion of the second connection line 342 may extend along the second direction Y, and the third connection line 343 may extend along the second direction Y. The first electrostatic discharge circuit may be electrically connected to the multiplexing data line through the second connection line 342. For example, the second connection line 342 may be located at the first gate metal layer and form an integrated structure with the multiplexing data line located at the first gate metal layer. Alternatively, the second connection line 342 may be located at the first gate metal layer and electrically connected with the multiplexing data line located at the second gate metal layer. The second electrostatic discharge circuit may be electrically connected to one drive signal line through the third connection line 343. For example, the third connection line 343 may be electrically connected to the drive output line 634.

In some examples, as shown in FIG. 8A and FIG. 8B, the second gate metal layer of the electrostatic discharge circuit may further include a first connection line 341. The first connection line 341 may extend along the second direction Y. However, the embodiment is not limited thereto.

In some examples as shown in FIG. 8C, the third insulation layer of the first bezel region is provided with a plurality of vias, which may include, for example, a thirty-first via V31 to a fifty-sixth via V56. The third insulation layer, the second insulation layer and the first insulation layer in the thirty-first via V31 to the forty-second via V42 can be removed to expose a surface of the active layer of the electrostatic discharge circuit. The third insulation layer and the second insulation layer in the forty-third via V43 to the fifth-second via V52 may be removed to expose a surface of the first gate metal layer. The third insulation layer in the fifty-fifth via V55 and the fifty-sixth via V56 may be removed to expose a surface of the second gate metal layer.

In some examples, as shown in FIG. 8A, the first source-drain metal layer of the electrostatic discharge circuit may include a plurality of connection electrodes (e.g. a first connection electrode 331 to a ninth connection electrode 339). The first connection electrode 331 may be electrically connected to the first active layer 301 of the first discharge transistor ST1*a* of the first electrostatic discharge circuit through the thirty-first via V31, and may also be electrically connected to the first connection line 341 through the fifty-fifth via V55. The first connection line 341 may be electrically connected to the fourth power supply line VGL through the fifty-sixth via V56. The second connection electrode 332 may be electrically connected to the gate 311 of the first discharge transistor ST1*a* through the forty-third via V43, and may also be electrically connected to the second active layer 302 of the second discharge transistor ST2*a* through the thirty-second via V32. The third connection electrode 333 may be electrically connected to the gate 312 of the second discharge transistor ST2*a* through the forty-fourth via V44, to the second active layer 302 of the second discharge transistor ST2*a* through the thirty-third via V33, to the second connection line 342 through the forty-fifth via V45, and to the third active layer 303 of the third discharge transistor ST3*a* through the thirty-fourth via V34. The fourth connection electrode 334 may be electrically connected to the gate 313 of the third discharge transistor ST3*a* through the forty-sixth via V46, and may also be electrically connected to the third active layer 303 of the third discharge transistor ST3*a* through the thirty-fifth via V35. The fifth connection electrode 335 may be electrically connected to the fourth active layer 304 of the fourth discharge transistor ST4*a* through the thirty-sixth via V36, to the gate 314 of the fourth discharge transistor ST4*a* through the forty-seventh via V47, to the fourth active layer 308 of the fourth discharge transistor ST4*b* of the second electrostatic discharge circuit through the thirty-seventh via V37, and to the gate 324 of the fourth discharge transistor ST4*b* through the forty-eighth via V48. The gate 314 of the fourth discharge transistor ST4*a* may be electrically connected to the third power supply line VGH through the fifty-third via V53. The sixth connection electrode 336 may be electrically connected to the fourth active layer 308 of the fourth discharge transistor ST4*b* of the second electrostatic discharge circuit through the thirty-eighth via V38, and may also be electrically connected to the gate 323 of the third discharge transistor ST3*b* through the forty-ninth via V49. The seventh connection electrode 337 may be electrically connected to the third active layer 307 of the third discharge transistor ST3*b* through the thirty-ninth via V39, to the third connection line 343 through the fiftieth via V50, to the second active layer 306 of the second discharge transistor ST2*b* through the fortieth via V40, and to the gate 322 of the second discharge transistor ST2*b* through the fifty-first via V51. The eighth connection electrode 338 may be electrically connected to the second active layer 306 of the second discharge transistor ST2*b* through the forty-first via V41, and may also be electrically connected to the gate 321 of the first discharge transistor ST1*b* through the fifty-second via V52. The ninth connection electrode 339 may be electrically connected to the first active layer 305 of the first discharge transistor ST1*b* through the forty-second via V42, and may also be electrically connected to the first electrode of the first discharge transistor of another first electrostatic discharge circuit. The third connection line 343 may be electrically connected to the drive output line 634 through the fifty-fourth via V54 to discharge static electricity in the drive output line 634.

Figure 9A:
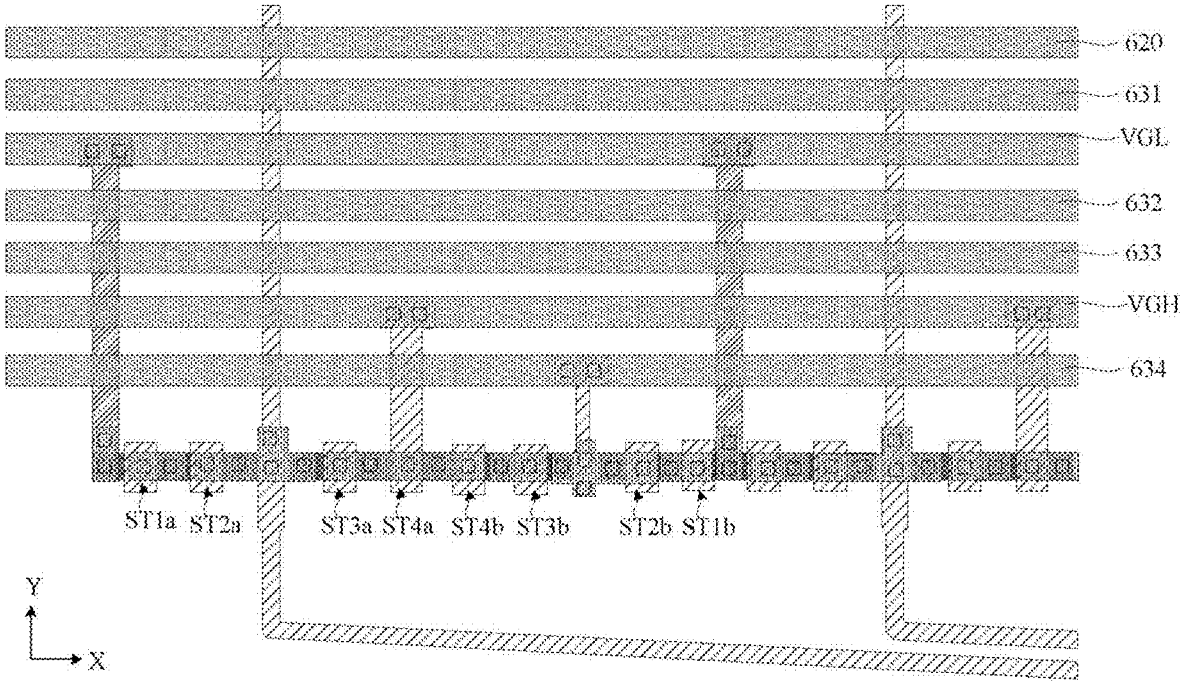
FIG. 9A is another diagram of a structure of an electrostatic discharge circuit according to at least one embodiment of the present disclosure.
Figure 9B:
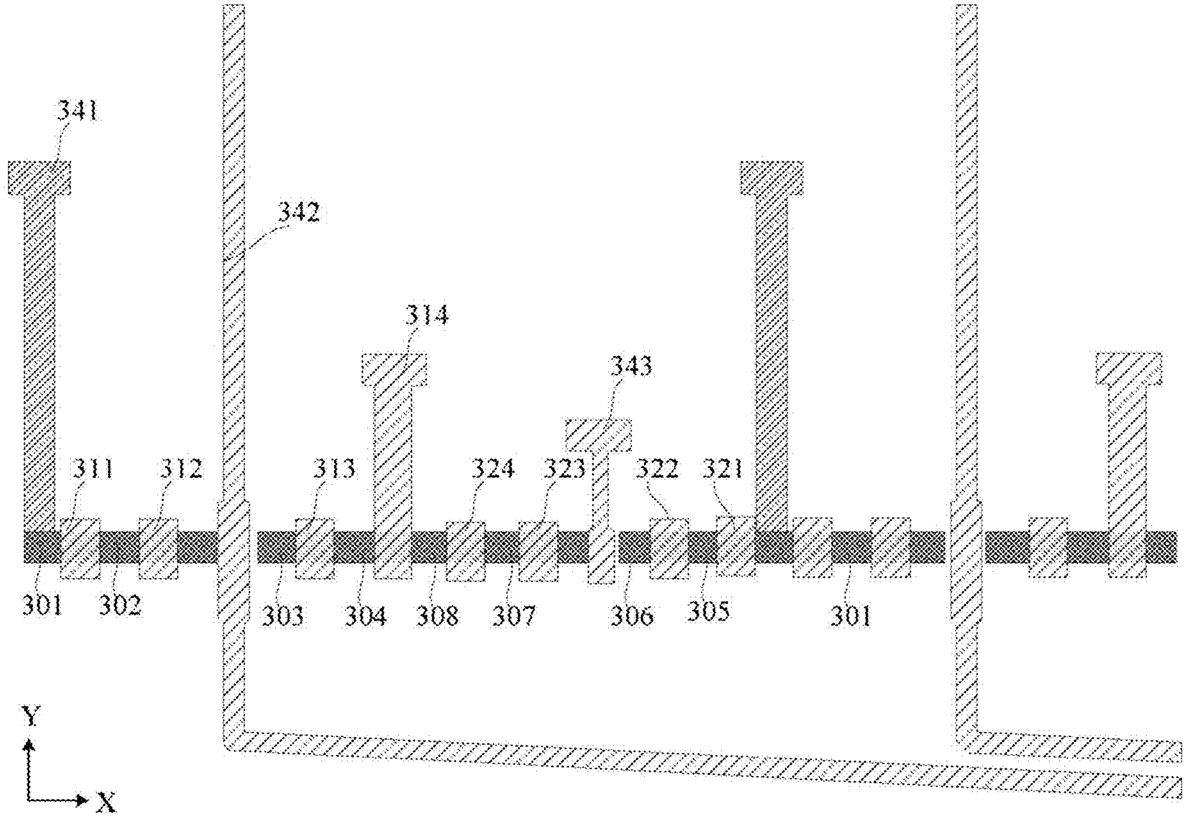
FIG. 9B is a schematic diagram of the electrostatic discharge circuit after forming a second gate metal layer in FIG. 9A.

FIG. 9A is another diagram of a structure of an electrostatic discharge circuit according to at least one embodiment of the present disclosure. FIG. 9B is a schematic diagram of the electrostatic discharge circuit after forming a second gate metal layer in FIG. 9A. FIG. 9A is a schematic diagram of an electrostatic discharge circuit after forming a first source-drain metal layer. In this example, the first electrostatic discharge circuit and the second electrostatic discharge circuit may be sequentially arranged along the first direction X and aligned. The second electrostatic discharge circuit may be located between two adjacent first electrostatic discharge circuits. The fourth active layer 308 of the fourth discharge transistor ST4*b* of the second electrostatic discharge circuit and the fourth active layer 304 of the fourth discharge transistor ST4*a* of an adjacent first electrostatic discharge circuit may form an integrated structure, and the first active layer 305 of the first discharge transistor ST1*b* of the second electrostatic discharge circuit and the first active layer 301 of the first discharge transistor ST1*a* of another adjacent first electrostatic discharge circuit may form an integrated structure. A rest of the structure of the electrostatic discharge circuit according to the present embodiment may be referred to descriptions of the aforementioned embodiments, and thus will not be repeated here.

In this example, the second electrostatic discharge circuit is disposed between the first electrostatic discharge circuits, so that the space occupied by the second electrostatic discharge circuit can be reduced, the trace arrangement can be simplified, the space can be greatly saved, thus facilitating the narrowing of the first bezel region (i.e., the lower bezel).

Figure 10:
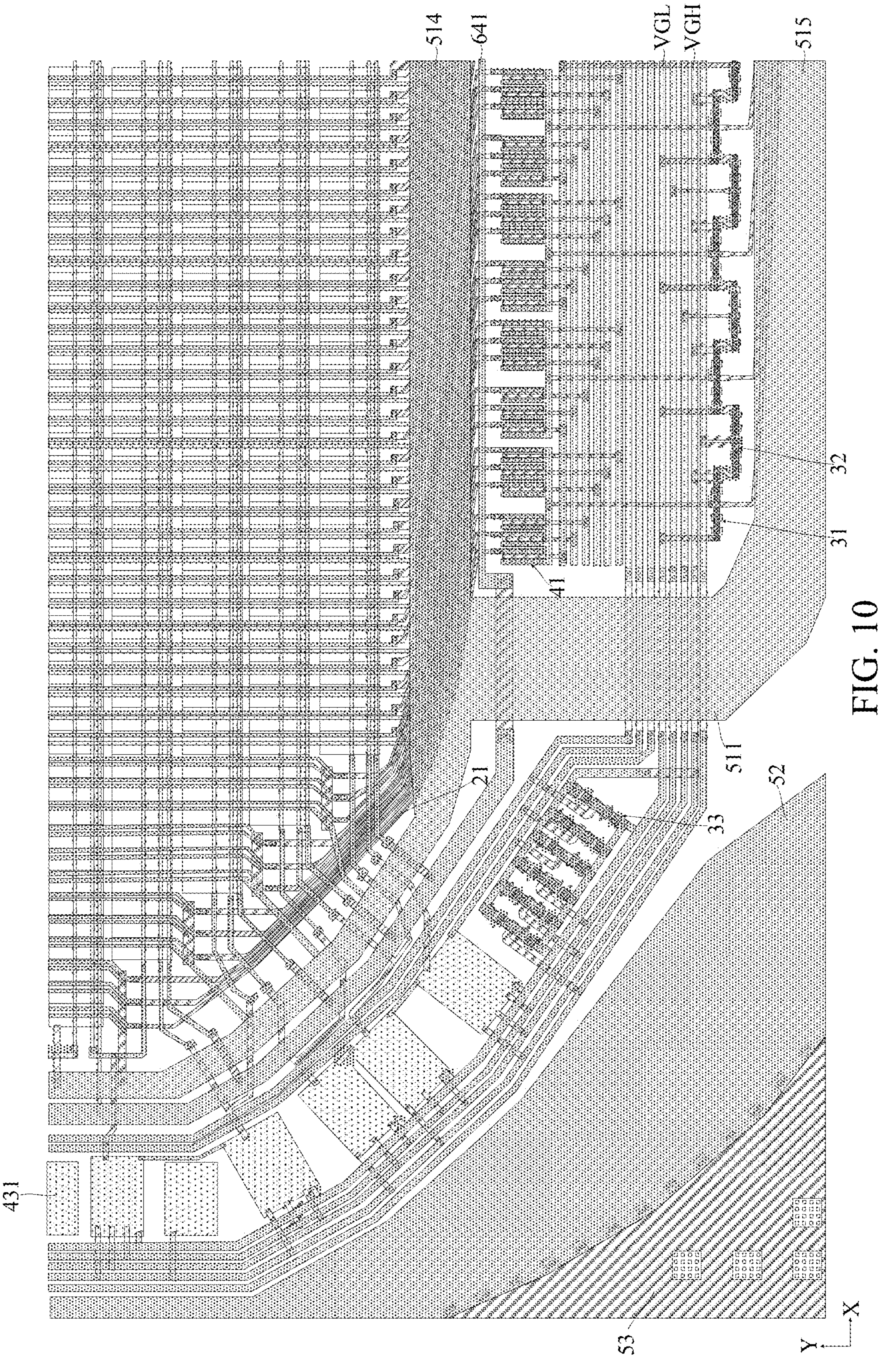
FIG. 10 is a partial schematic diagram of a first corner region according to at least one embodiment of the present disclosure.

FIG. 10 is a partial schematic diagram of a first corner region according to at least one embodiment of the present disclosure. In some examples, as shown in FIG. 1, the gate drive circuit may include a plurality of cascaded drive units 431. The drive unit 431 may be provided in the third bezel region and the first corner region and arranged in sequence along the edge extension direction of the display region. The multiplexing circuit 41, the first electrostatic discharge circuit 31 and the second electrostatic discharge circuit 32 may be located in the first bezel region. The multiplexing circuit 41 close to a junction of the first bezel region and the first corner region may be electrically connected to a column of pixel circuits in a left edge region of the display region through arc-shaped data fan-out lines 21. The plurality of drive signal lines in the first bezel region may extend to the first corner region and be switched by a switch line located in the first gate metal layer to avoid collision with the first sub-power supply line 511. An initial signal line 641 may also be provided at a side of the fourth sub-power supply line 514 close to the multiplexing circuit 41.

In some examples, as shown in FIG. 10, a third electrostatic discharge circuit 33 may also be provided in the first corner region. The third electrostatic discharge circuit 33 may be located at a side of the drive unit 431 close to the junction of the first corner region and the first bezel region. The third electrostatic discharge circuit 33 may be electrically connected to the drive signal line extending to the first corner region to discharge static electricity of the drive signal line. However, the embodiment is not limited thereto. For example, the first corner region may not be provided with an electrostatic discharge circuit to save space and facilitate narrowing of the first corner region.

In some examples, as shown in FIG. 10, a second power supply line 52 and an encapsulation trace 53 located at a side of the second power supply line 52 away from the display region are also provided in the first corner region and the third bezel region. The encapsulation trace 53 may be electrically connected to the second power supply line 52. The second power supply line 52 may be arranged in a different layer from the encapsulation trace 53. For example, the encapsulation trace 53 may be located at a side of the second power supply line 52 close to the base substrate.

Figure 11:
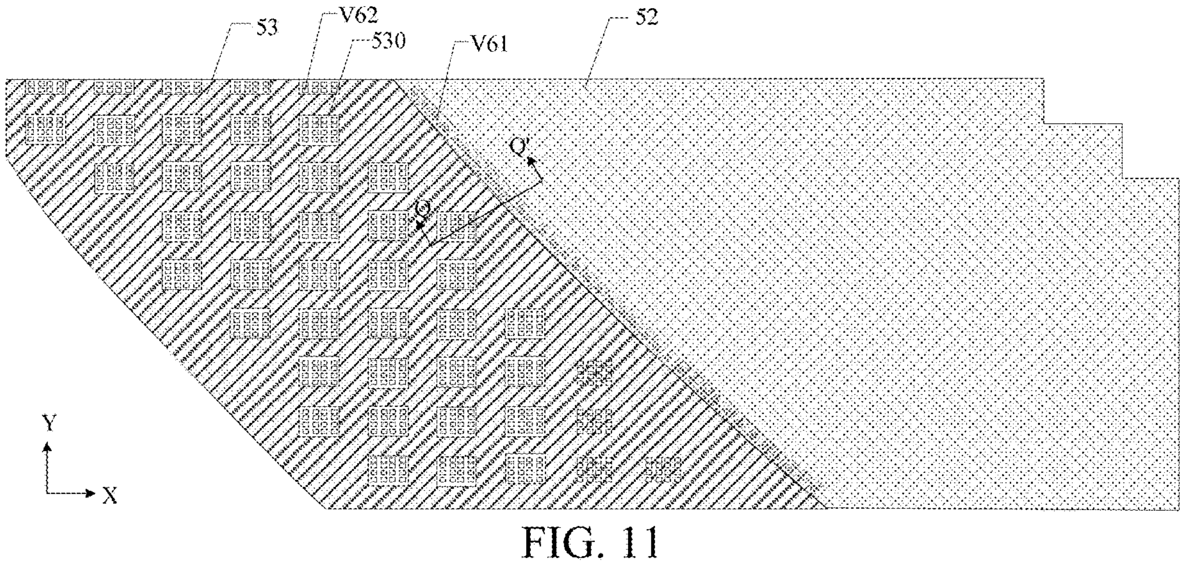
FIG. 11 is a partial schematic diagram of an encapsulation trace of a first corner region according to at least one embodiment of the present disclosure.
Figure 12:
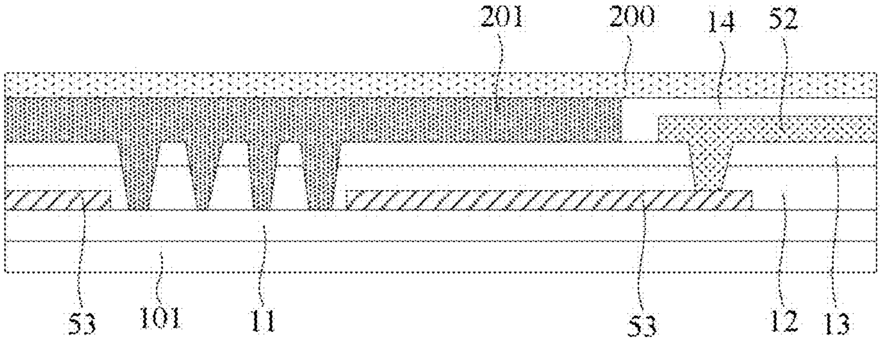
FIG. 12 is a schematic partial cross-sectional view along a Q-Q' direction in FIG. 11.

FIG. 11 is a partial schematic diagram of an encapsulation trace of a first corner region according to at least one embodiment of the present disclosure. FIG. 12 is a schematic partial cross-sectional view along a Q-Q' direction in FIG. 11. In some examples, as shown in FIG. 11, the encapsulation trace 53 may be provided with a plurality of openings 530. An orthographic projection of the opening 530 on the base substrate may be rectangular, for example. As shown in FIG. 12, the encapsulation trace 53 may be located in the first gate metal layer, and the second power supply line 52 may be located in the first source-drain metal layer. An edge of the encapsulation trace 53 close to the second power supply line 52 has a plurality of protrusions, and the plurality of protrusions can be electrically connected to the second power supply line 52 through the sixty-first via V61. The second insulation layer 12 and the third insulation layer 13 in the sixty-first via V61 can be removed to expose a surface of the protrusion of the second power supply line 52. A plurality of via arrays V62 may also be provided on the second insulation layer 12 and the third insulation layer 13. An orthographic projection of the opening 530 provided on the encapsulation trace 53 on the base substrate 101 may be overlapped with an orthographic projection of the via array V62 on the base substrate 101. The via array V62 may be filled with an encapsulation glue 201, so that the encapsulation cover plate 200 is fixed by the encapsulation glue 201.

Figure 13:
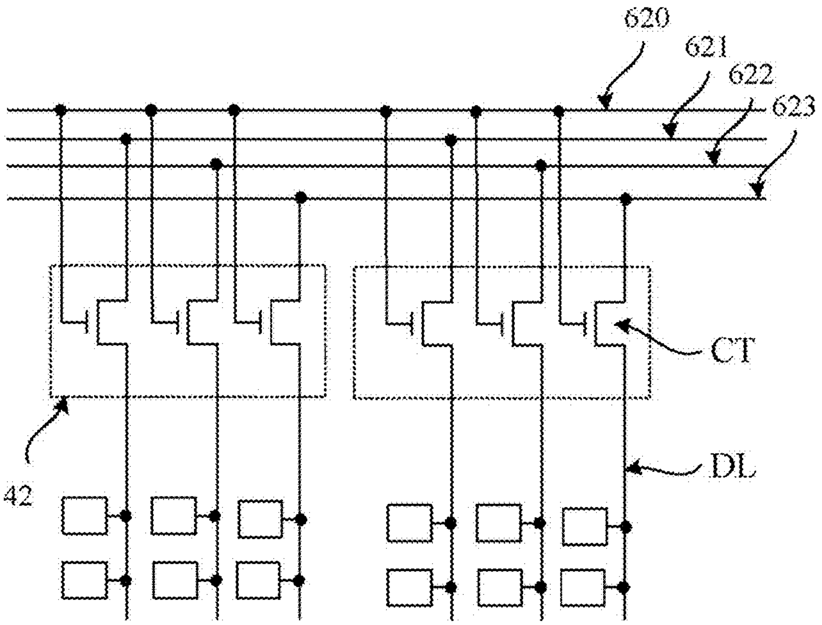
FIG. 13 is an equivalent circuit diagram of a test circuit according to at least one embodiment of the present disclosure.

FIG. 13 is an equivalent circuit diagram of a test circuit according to at least one embodiment of the present disclosure. In some examples, the test circuit may include b test transistors and may be electrically connected to at least one test control line and b test data lines, where b may be a positive integer greater than or equal to 2. FIG. 13 is illustrated by taking one test control line, three test data lines and two test circuits 42 (each test circuit 42 including three test transistors CT) as an example. As shown in FIG. 13, gates of the three test transistors CT in the same test circuit 42 are connected to the same test control line 620. The first electrodes of the three test transistors CT are connected with different test data lines, namely, a first electrode of a first test transistor is connected with a first test data line 621, a first electrode of a second test transistor is connected with a second test data line 622, and a first electrode of a third test transistor is connected with a third test data line 623. The second electrodes of the three test transistors CT are connected with different data lines DL in the display region, namely, a second electrode of the first test transistor is connected with a data line DL, a second electrode of the second test transistor is connected with another data line DL, and a second electrode of the third test transistor is connected with yet another data line DL. In this way, through the test control signal wire 620, the turn-on of three test transistors CT in the test circuit 42 can be controlled, and the signals of different test data lines can be controlled to be written into different data lines DL. During the test, the control device provides a turn-on signal to the test control line 620, and provides the required test data signals to multiple test data lines respectively, so that multiple data lies in the display region can obtain the test data signals to achieve detection. In some examples, the test control line 620 and the first test data line 621 may extend from the first bezel region through the first corner region, the third bezel region and the second corner region to the second bezel region, and the second test data line 622 and the third test data line 623 may extend from the first bezel region through the fourth corner region, the fourth bezel region and the third corner region to the second bezel region.

In some examples, the color of the sub-pixels connected with each data line is the same. During the test, a same test data signal is provided to the data lines corresponding to the sub-pixels of a same color, so that these sub-pixels can be displayed in the same way, and determine whether there is a defective sub-pixel through the color of the display image, and locate the defective sub-pixel.

Figure 14A:
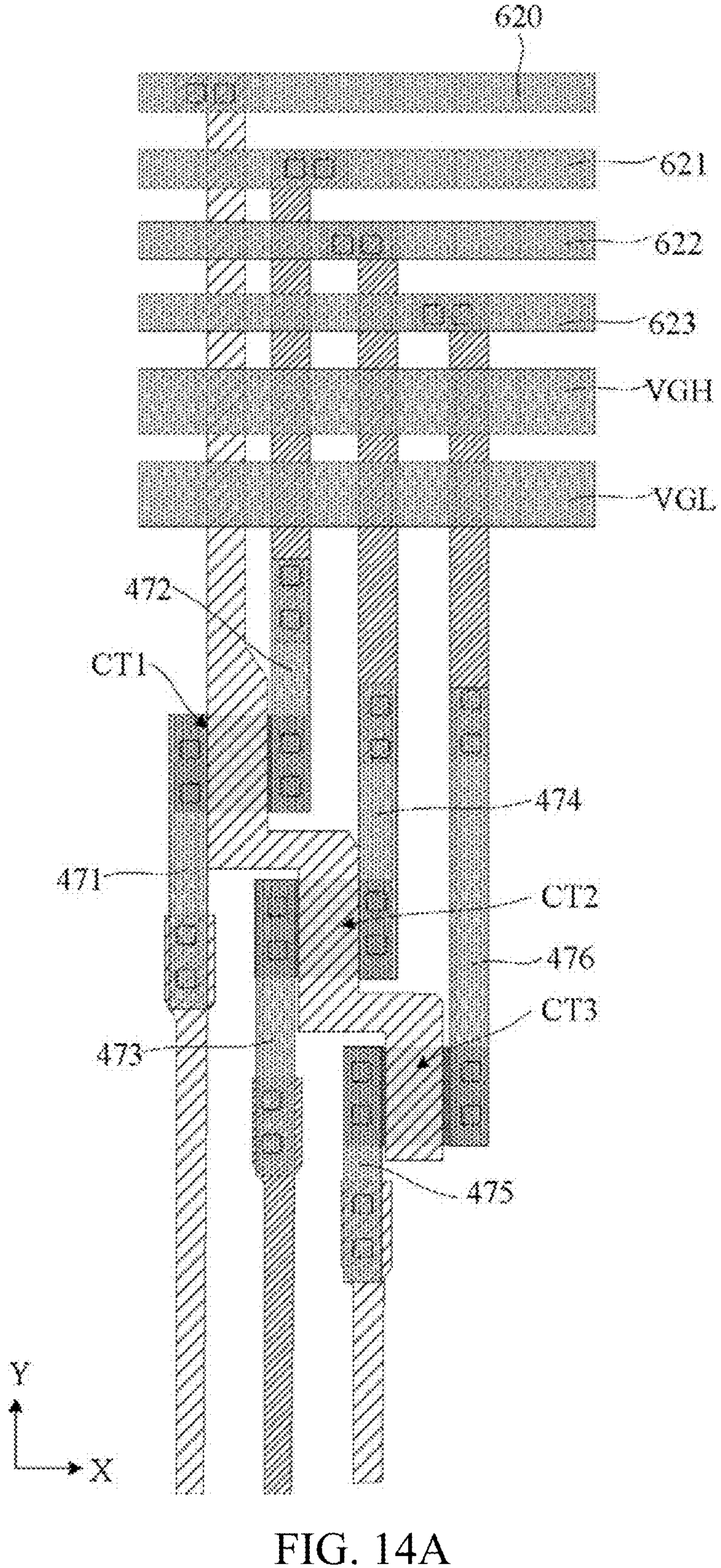
FIG. 14A is a schematic diagram of a structure of a test circuit according to at least one embodiment of the present disclosure.
Figure 14B:
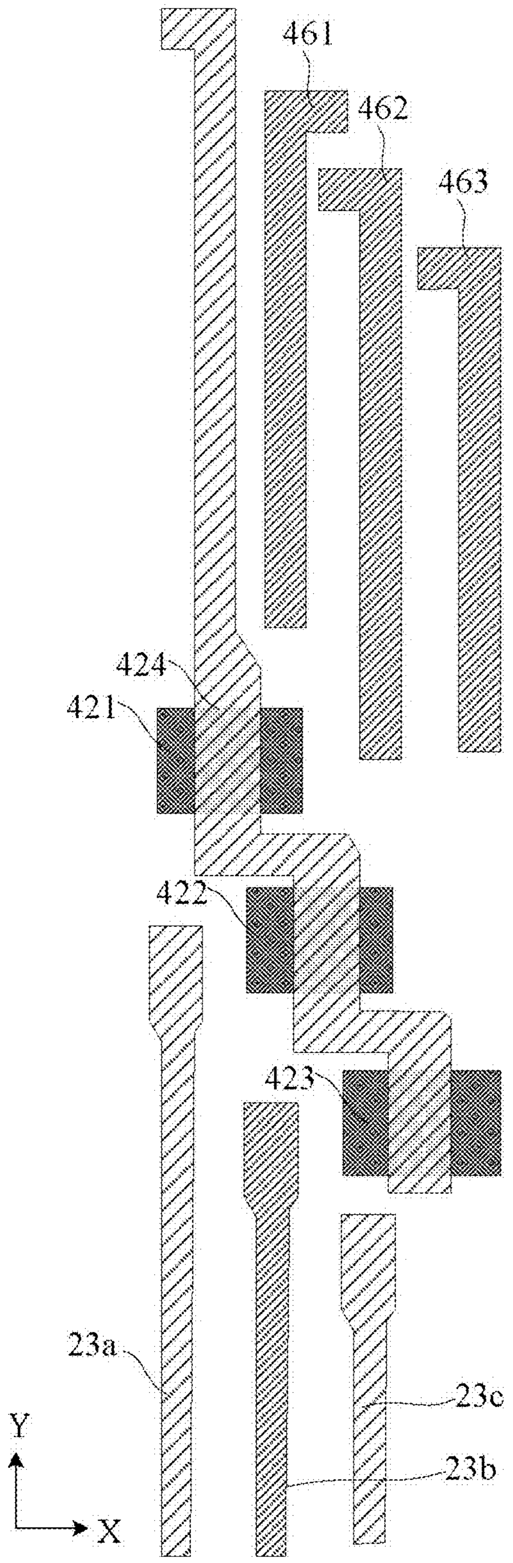
FIG. 14B is a schematic diagram of the test circuit after forming a second gate metal layer in FIG. 14A.
Figure 14C:
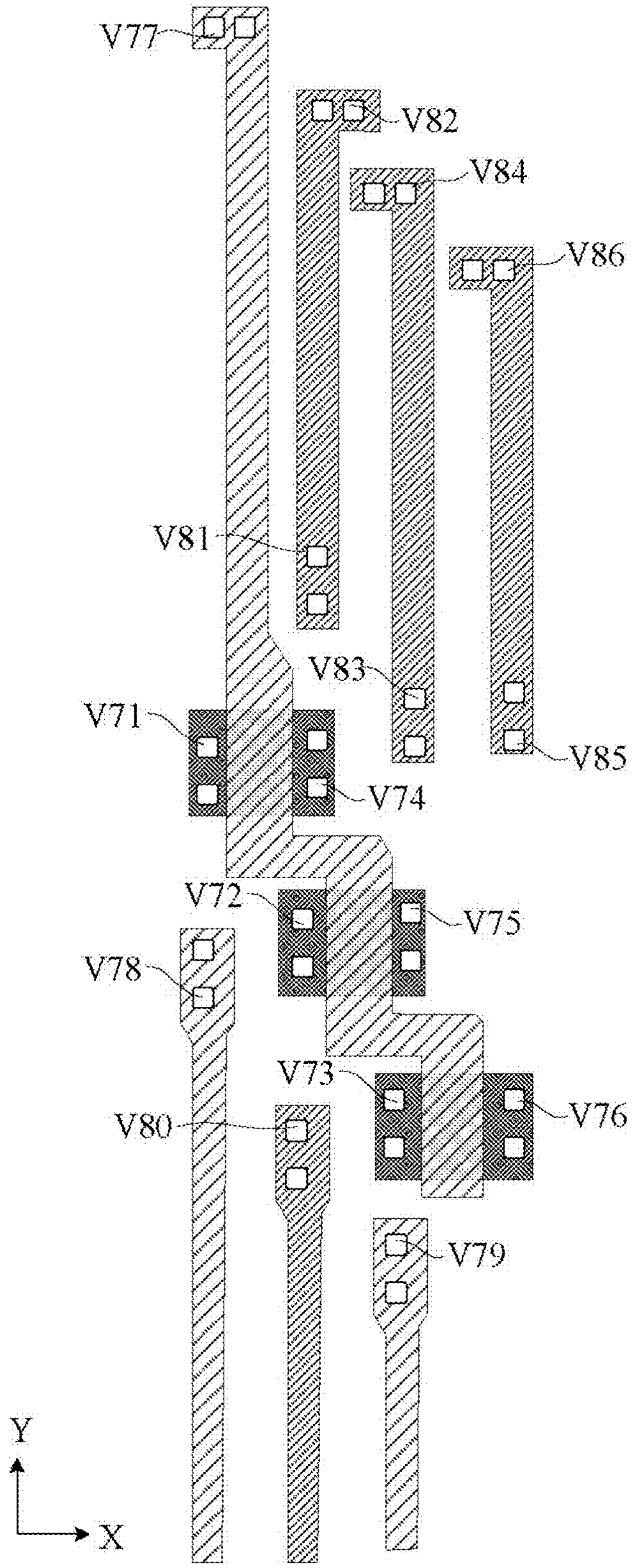
FIG. 14C is a schematic diagram of the test unit after forming a third insulation layer in FIG. 14A.

FIG. 14A is a schematic diagram of a structure of a test circuit according to at least one embodiment of the present disclosure. FIG. 14B is a schematic diagram of the test circuit after forming a second gate metal layer in FIG. 14A. FIG. 14C is a schematic diagram of the test unit after forming a third insulation layer in FIG. 14A. FIG. 14A is a schematic diagram of the test circuit after forming a first source-drain metal layer. FIG. 14A to FIG. 14C are illustrated by taking one test circuit as an example, and an equivalent circuit diagram of the test circuit is as shown in FIG. 13. For example, the test circuit may include a first test transistor CT1, a second test transistor CT2 and a third test transistor CT3. Three test transistors are sequentially arranged along the second direction Y, and misaligned in the first direction X. For example, the first test transistors CT1 to the third test transistors CT3 may be arranged in a staircase shape.

In some examples as shown in FIG. 14A to FIG. 14B, an orthographic projection of the first active layer 421 of the first test transistor CT1, an orthographic projection of the second active layer 422 of the second test transistor CT2, and an orthographic projection of the third active layer 423 of the third test transistor CT3 on the base substrate may all be rectangular. The first active layer 421, the second active layer 422 and the third active layer 423 may be arranged in a staircase shape.

In some examples as shown in FIG. 14A and FIG. 14B, a first gate electrode 424 of the first test transistor CT1, a second gate electrode of the second test transistor CT2, and a third gate electrode of the third test transistor CT3 may form an integrated structure. The first gate metal layer of the test circuit may include first data connection lines 23*a* and 23*c*, and the second gate metal layer of the test circuit may include a first data connection line 23*b* and second data connection lines 461, 462 and 463. The first data connection lines 23*a*, 23*b*, and 23*c* may be located at a side, close to the display region, of the active layers of the three test transistors, and at least part of the line segments may extend along the second direction Y toward the a side of display region so as to be electrically connected with the data lines of the display region. The second data connection lines 461, 462, and 463 may be located at a side, away from the display region, of the active layers of the three test transistors, and may extend to a side of the display region away from the display region along the second direction Y, so as to be electrically connected with the test data line. The first data connection lines 23*a*, 23*b*, and 23*c* may be arranged sequentially along the first direction X, and the second data connection lines 461, 462, and 463 may be arranged sequentially along the first direction X.

In some examples as shown in FIG. 14C, the third insulation layer of the second bezel region is provided with a plurality of vias, which may include, for example, a seventy-first via V71 to an eighty-sixth via V86. The third insulation layer, the second insulation layer and the first insulation layer in the seventy-first via V71 to the seventy-sixth via V76 can be removed to expose surfaces of the active layers of the three test transistors. The third insulation layer and the second insulation layer in the seventy-seventh via V77 to the seventy-ninth via V79 can be removed to expose a surface of the first gate metal layer of the test circuit. The third insulation layer in the eightieth Via V80 to eighty-sixth Via V86 can be removed to expose a surface of the second gate metal layer of the test circuit.

In some examples as shown in FIG. 14A to FIG. 14C, the first source-drain metal layer of the test circuit may include a test control line 620, a first test data line 621, a second test data line 622, a third test data line 623, and the first electrodes and the second electrodes of the three test transistors. A third power supply line VGH and a fourth power supply line VGL may be provided at a side of the third test data line 623 close to the actives layer of the three test transistors. The test control line 620 may be electrically connected to the gate 424 of the first test transistor CT1 through the seventy-seventh via V77. The first electrode 471 of the first test transistor CT1 may be electrically connected to the first active layer 421 through the seventy-first via V71, and may also be electrically connected to the first data connection line 23*a* through the seventy-eighth via V78. The second electrode 472 of the first test transistor CT1 may be electrically connected to the first active layer 421 through the seventy-fourth via V74, and may also be electrically connected to the second data connection line 461 through the eighty-first via V81. The second data connection line 461 may be electrically connected to the first test data line 621 through the eighty-second via V82. The first electrode 473 of the second test transistor CT2 may be electrically connected to the second active layer 422 through the seventy-second via V72, and may also be electrically connected to the first data connection line 23*b* through the eightieth via V80. The second electrode 474 of the second test transistor CT2 may be electrically connected to the second active layer 422 through the seventy-fifth via V75, and may also be electrically connected to the second data connection line 462 through the eighty-third via V83. The second data connection line 462 may be electrically connected to the second test data line 622 through the eighty-fourth via V84. The first electrode 475 of the third test transistor CT3 may be electrically connected to the third active layer 423 through the seventy-third via V73, and may also be electrically connected to the first data connection line 23*c* through the seventy-ninth via V79. The second electrode 476 of the third test transistor CT3 may be electrically connected to the third active layer 423 through the seventy-sixth via V76, and may also be electrically connected to the second data connection line 463 through the eighty-fifth via V85. The second data connection line 463 may be electrically connected to the third test data line 623 through the eighty-sixth via V86.

In the present example, the plurality of first data connection lines may be divided into two groups, respectively located at the first gate metal layer and the second gate metal layer, and the two groups of first data connection lines may be arranged at intervals along the first direction, thereby reducing a gap between adjacent first data connection lines and ensuring a transmission effect. In other examples, the plurality of first data connection lines may all be located in the first gate metal layer. Since the parasitic capacitance generated per the unit area where the first gate metal layer and the first source-drain metal layer are overlapped is less than the parasitic capacitance generated per the unit area where the second gate metal layer and the first source-drain metal layer are overlapped, the parasitic capacitance can be effectively reduced by disposing the first data connection lines in the first gate metal layer, thereby achieving a load reduction effect and optimizing the test effect.

Figure 15:
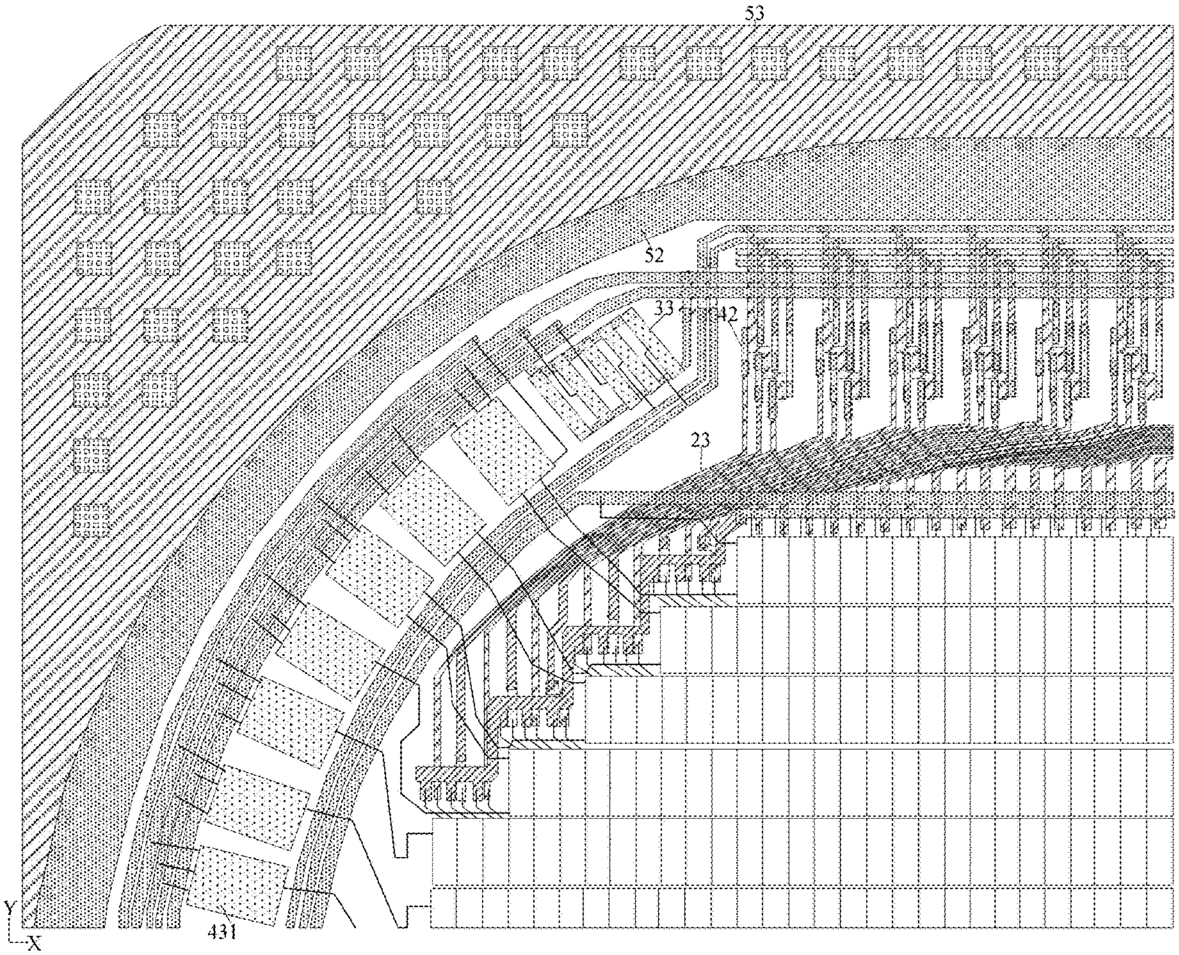
FIG. 15 is a partial schematic diagram of a second corner region according to at least one embodiment of the present disclosure.

FIG. 15 is a partial schematic diagram of a second corner region according to at least one embodiment of the present disclosure. In some examples, as shown in FIG. 15, the drive unit 431 of the gate drive circuit may be provided in the third bezel region and the second corner region and arranged sequentially along the edge extension direction of the display region. The test circuits 42 may be located in the second bezel region and arranged in sequence along the first direction X. The test circuit 42 close to a junction of the second bezel region and the second corner region may be electrically connected to a column of pixel circuits in the left edge region of the display region through the arc-shaped first data connection line 23.

In some examples, as shown in FIG. 15, a third electrostatic discharge circuit 33 may also be provided in the second corner region. The third electrostatic discharge circuit 33 may be located at a side of the drive unit 431 close to the junction of the second corner region and the second bezel region. The third electrostatic discharge circuit 33 may be electrically connected to the drive signal line extending to the second corner region to discharge static electricity of the drive signal line.

In this example, the test circuit is not disposed in the second corner region and the third corner region, so that the arrangement space of the drive unit 431 in the corner region can be increased, and the drive unit arranged close to a side of the display region, thereby realizing a narrow bezel design.

Figure 16:
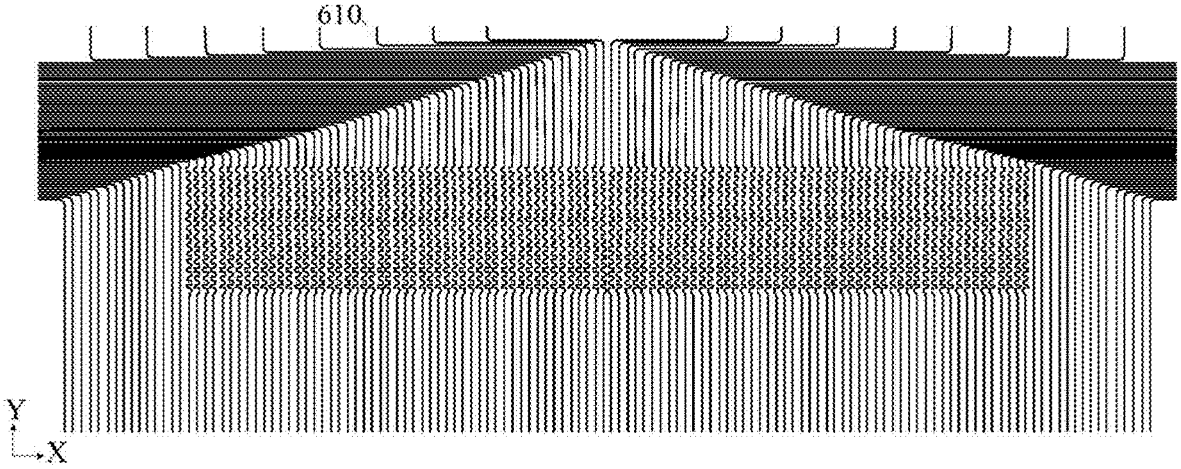
FIG. 16 is a schematic partial enlarged view of a region A2 in FIG. 3.

FIG. 16 is a schematic partial enlarged view of a region A2 in FIG. 3. In some examples, as shown in FIG. 16, the multiplexing data line 610 electrically connected to the first electrostatic discharge circuit may extend toward a side of the signal access region. Since the quantity of sub-pixels connected to the data lines in the middle region is different from that of the left and right edge regions in the display region, compensation for the corresponding data lines can be realized by connecting compensation resistors in series to the part of multiplexing data lines 342. In some examples, the compensation resistor can be a serpentine trace. The serpentine trace is a bending curve. For example, after one end of the trace extends along one direction for a certain distance, it bends circuitously and extends along a direction opposite to this direction for a certain distance, and bends circuitously again and extends along this direction. In this way, circuitous bending is repeated for several times to form the serpentine trace. In some examples, the multiplexing data line 342 may also be electrically connected to the compensation resistor through the second connection line 342.

In this example, the compensation resistor to which the multiplexing data line 610 is electrically connected may be located in the encapsulation region as a second encapsulation adhesive underlay substrate. The first encapsulation adhesive underlay substrate and the second encapsulation adhesive underlay substrate may be arranged in sequence along the first direction X. In this example, by using the compensation resistor as the second encapsulation adhesive underlay substrate, the contact area between the encapsulation adhesive and the encapsulation adhesive underlay substrate can be increased, thereby improving the encapsulation ability, achieving better water-oxygen barrier and sealing effect, and making the curing effect and encapsulation effect of the encapsulation adhesive (for example, Frit adhesive) better.

Figure 17:
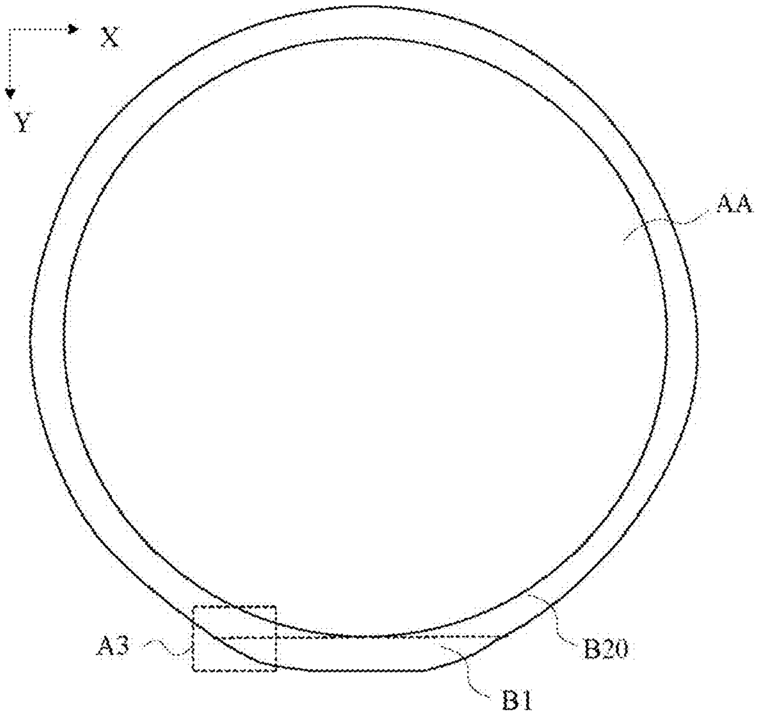
FIG. 17 is another schematic diagram of a display panel according to at least one embodiment of the present disclosure.

FIG. 17 is another schematic diagram of a display panel according to at least one embodiment of the present disclosure. In some examples, as shown in FIG. 17, the display panel may include a display substrate. The display substrate may include a display region AA, and a bezel region located around the display region AA. The bezel region may include a first bezel region B1 located at a side of the display region AA and a remaining bezel region B20 located at remaining sides of the display region AA. In this example, the display substrate can be circular or elliptical.

Figure 18:
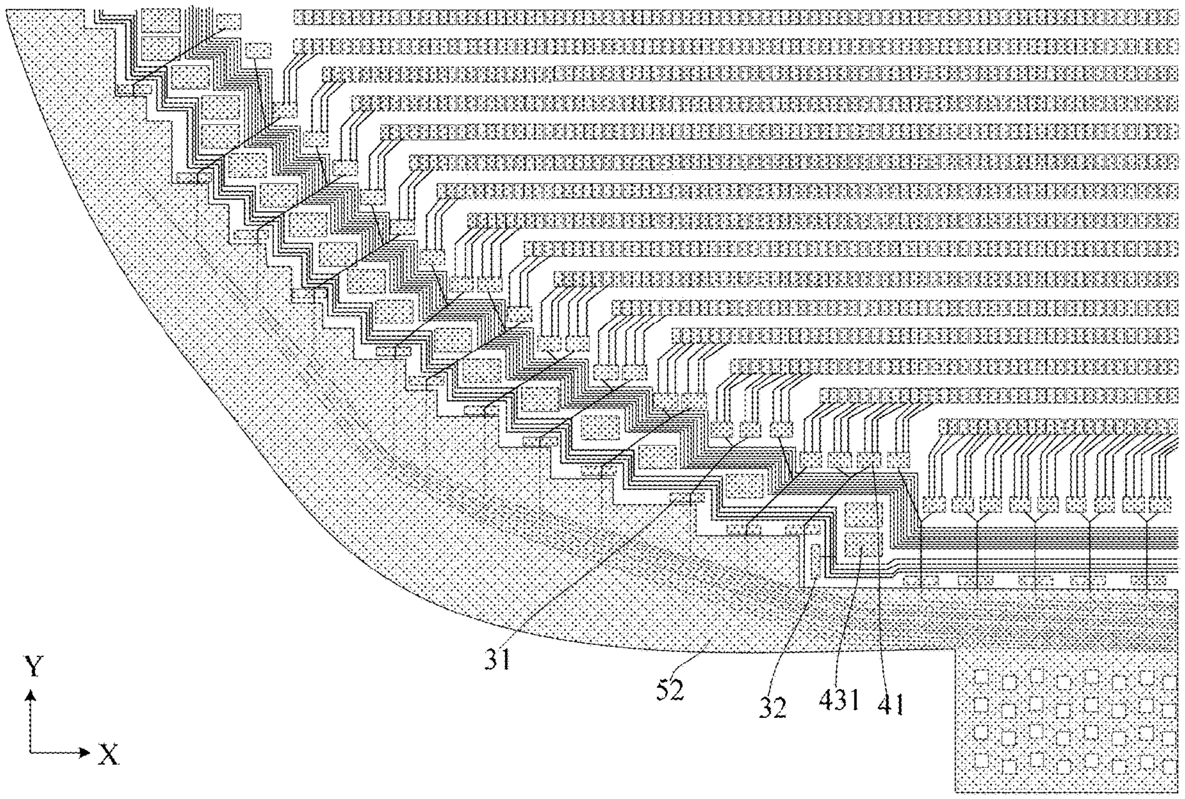
FIG. 18 is a schematic partial enlarged view of a region A3 in FIG. 17.

FIG. 18 is a schematic partial enlarged view of a region A3 in FIG. 17. In some examples, as shown in FIG. 18, the multiplexing circuit 41, the first electrostatic discharge circuit 31 and the second electrostatic discharge circuit 32 may be located in the bezel region. The second electrostatic discharge circuit 32 may extend along the second direction Y. Within the first bezel region B1, a plurality of multiplexing circuits 41 may be arranged side by side along the first direction X. In the remaining bezel region B20, the multiplexing circuits may be arranged in a staircase shape along the edge extension direction of the display region AA. The gate drive circuit may include a plurality of cascaded drive units 431 which may be arranged in a staircase shape along the edge extension direction of the display region within the remaining bezel region B20. In the first bezel region B1, a plurality of first electrostatic discharge circuits 31 may be arranged side by side along the first direction X, and in the remaining bezel regions B20, a plurality of first electrostatic discharge circuits 31 may be arranged in a staircase shape along the edge extension direction of the display region AA. The second electrostatic discharge circuit 32 may be located within the first bezel region B1 or the remaining bezel region B20 and may be interspersed between the first electrostatic discharge circuits 31. For example, a plurality of discharge transistors of the first electrostatic discharge circuit 31 may be arranged side by side along the first direction X, and a plurality of discharge crystals of the second electrostatic discharge circuit 32 may be arranged in sequence along the second direction Y. However, the embodiment is not limited thereto. In this example, by arranging the second electrostatic discharge circuit between the first electrostatic discharge circuits, the circuit arrangement can be optimized, which is beneficial to realize the narrow bezel design.

Rest of the structure of the display substrate according to this embodiment may be referred to descriptions of the aforementioned embodiments, and will not be repeated here.

The structure of the display substrate of this exemplary embodiment is described only as an example. In some exemplary implementation, a corresponding structure may be changed and a patterning process may be added or removed according to actual needs. For example, the display region may be provided with a first source-drain metal layer and a second source-drain metal layer, the first source-drain metal layer may include source electrodes and drain electrodes of transistors, and the second source-drain metal layer may include connection electrodes between light emitting elements and the drain electrodes of the transistors. However, the embodiment is not limited thereto.

A display device is also provided in an embodiment of the present disclosure, including the display panel in the aforementioned embodiments.

Figure 19:
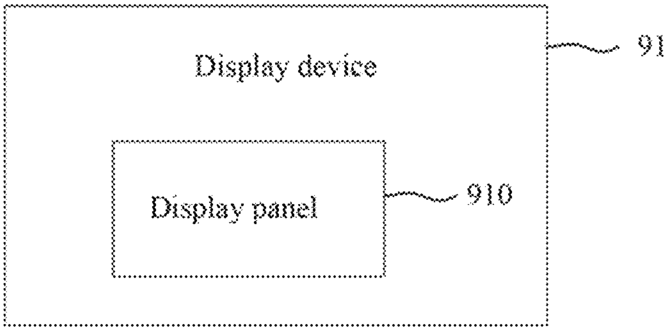
FIG. 19 is a schematic diagram of a display device according to at least one embodiment of the present disclosure.

FIG. 19 is a schematic diagram of a display device according to at least one embodiment of the present disclosure. In some examples, as shown in FIG. 19, a display panel 910 may be an OLED display panel. A display device 91 may be any product or component with a display function, such as an OLED display device, a mobile phone, a tablet computer, a television, a display, a notebook computer, a digital photo frame, or a navigator. However, the embodiment is not limited thereto.

The drawings of the present disclosure only involve structures involved in the present disclosure, and other structures may refer to conventional designs. The embodiments of the present disclosure, i.e., features in the embodiments, may be combined with each other to obtain new embodiments if there is no conflict. Those of ordinary skills in the art should understand that modifications or equivalent replacements may be made to the technical solutions of the present disclosure without departing from the essence and scope of the technical solutions of the present disclosure, and shall all fall within the scope of the claims of the present disclosure.

The invention claimed is:

1. A display substrate, comprising a display region and a bezel region located around the display region, the display substrate comprising:

a base substrate;

a plurality of data lines located on the base substrate, located in the display region, wherein the plurality of data lines are configured to provide data signals to pixels of the display region;

a plurality of multiplexing circuits, a plurality of multiplexing data lines, a plurality of first electrostatic discharge circuits, a plurality of second electrostatic discharge circuits, and a plurality of first signal lines located in the bezel region;

wherein the plurality of multiplexing circuits are sequentially arranged along edges of the display region, the plurality of multiplexing circuits are electrically connected with the plurality of multiplexing data lines and the plurality of data lines, the plurality of first electrostatic discharge circuits are electrically connected with the plurality of multiplexing data lines, and the plurality of second electrostatic discharge circuits are electrically connected with the plurality of first signal lines;

the plurality of first electrostatic discharge circuits and the plurality of second electrostatic discharge circuits are located at a side of the plurality of multiplexing circuits away from the display region, and the plurality of second electrostatic discharge circuits are interspersed in the plurality of first electrostatic discharge circuits, wherein the bezel region comprises a first bezel region located at a side of the display region in a second direction, and the plurality of multiplexing circuits are located in the first bezel region and arranged side by side along a first direction, and the first direction intersects with the second direction, wherein the display substrate further comprises a first power supply line located in the bezel region, and the first power supply line at least comprises a first sub-power supply line, a second sub-power supply line and a third sub-power supply line located in the first bezel region; the first sub-power supply line, the second sub-power supply line and the third sub-power supply line all extend along the second direction; the plurality of multiplexing circuits are separated by the second sub-power supply lines in the first direction.

2. The display substrate according to claim 1, wherein at least one of the plurality of second electrostatic discharge circuits is located at a side of the plurality of first electrostatic discharge circuits away from the display region.

3. The display substrate according to claim 1, wherein the plurality of multiplexing circuits are electrically connected to the plurality of data lines in the display region through a plurality of data fan-out lines, and the plurality of data fan-out lines are of same layer structure.

4. The display substrate according to claim 1, wherein the display substrate has a first centerline parallel to the second direction, the plurality of second electrostatic discharge circuits are located in a region, close to the first centerline, within the first bezel region and an edge region, away from the first centerline, within the first bezel region.

5. The display substrate according to claim 4, wherein the plurality of first signal lines comprises a plurality of multiplexing control lines and a plurality of drive signal lines.

6. The display substrate according to claim 5, wherein the plurality of second electrostatic discharge circuits located at edges of the first bezel region away from the first centerline is electrically connected to the plurality of drive signal lines respectively to discharge static electricity of the plurality of drive signal lines.

7. The display substrate according to claim 1, wherein the bezel region further comprises a second bezel region located at a side of the display region away from the first bezel region along the second direction;

the display substrate further comprises a plurality of test circuits located in the second bezel region, and the plurality of test circuits are arranged side by side along the first direction.

8. The display substrate according to claim 7, wherein the bezel region further comprises a third bezel region and a fourth bezel region located at opposite sides of the display region along the first direction, a first corner region connecting the first bezel region and the third bezel region, a second corner region connecting the third bezel region and the second bezel region, a third corner region connecting the second bezel region and the fourth bezel region, and a fourth corner region connecting the fourth bezel region and the first bezel region, the display substrate further comprises a gate drive circuit located in the third bezel region, the fourth bezel region, the first corner region, the second corner region, the third corner region and the fourth corner region.

9. The display substrate according to claim 8, wherein the plurality of multiplexing circuits close to the first corner region and the fourth corner region are electrically connected to the plurality of data lines of the display region through arc-shaped data fan-out lines.

10. The display substrate according to claim 8, wherein a test circuit close to the second corner region and the third corner region is electrically connected to the plurality of data lines of the display region through arc-shaped data connection lines.

11. The display substrate according to claim 8, wherein the plurality of multiplexing circuits are not provided in the first corner region and the fourth corner region, and the plurality of multiplexing circuits are all provided in the first bezel region.

12. The display substrate according to claim 1, wherein the first power supply line further comprises a fourth sub-power supply line and a fifth sub-power supply line located in the first bezel region; the fourth sub-power supply line and the fifth sub-power supply line both extend along the first direction, and the fourth sub-power supply line is located at a side of the fifth sub-power supply line close to the display region; the fourth sub-power supply line and the fifth sub-power supply line are both electrically connected to the first sub-power supply line, the second sub-power supply line and the third sub-power supply line; the plurality of multiplexing circuits, the plurality of first electrostatic discharge circuits and the plurality of second electrostatic discharge circuits are located between the fourth sub-power supply line and the fifth sub-power supply line.

13. The display substrate according to claim 12, wherein at least one of the plurality of multiplexing data lines is electrically connected to a compensation resistor located at a side of the first electrostatic discharge circuit away from the display region;

the first bezel region at least comprises a peripheral circuit region, a signal access region located at a side of the peripheral circuit region away from the display region, and an encapsulation region located between the peripheral circuit region and the signal access region, wherein the compensation resistor is located in the encapsulation region and serves as an encapsulation underlay substrate.

14. The display substrate according to claim 13, wherein a portion of the fifth sub-power supply line located within the encapsulation region, and a portion of the second power supply line located within the encapsulation region serve as a first encapsulation adhesive underlay substrate, and a plurality of openings are provided on the first encapsulation adhesive underlay substrate.

15. The display substrate according to claim 1, wherein an arrangement direction of a plurality of discharge transistors included in the first electrostatic discharge circuit and an arrangement direction of a plurality of discharge transistors included in the second electrostatic discharge circuit are opposite.

16. A display panel comprising the display substrate according to claim 1, further comprising light emitting elements arranged in the display region of the display substrate, wherein the light emitting elements are arranged in an array.

17. A display device comprising the display panel according to claim 16.

18. The display substrate according to claim 1, wherein a first power supply signal is transmitted to a side close to the display region through the first sub-power supply line, the second sub-power supply line and the third sub-power supply line.

* * * * *